(12) United States Patent
Inno

(10) Patent No.: US 8,921,033 B2
(45) Date of Patent: Dec. 30, 2014

(54) METHOD OF PREPARING LITHOGRAPHIC PRINTING PLATE AND DEVELOPER FOR LITHOGRAPHIC PRINTING PLATE PRECURSOR

(75) Inventor: Toshifumi Inno, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/581,040

(22) PCT Filed: Feb. 22, 2011

(86) PCT No.: PCT/JP2011/053871
§ 371 (c)(1),
(2), (4) Date: Aug. 24, 2012

(87) PCT Pub. No.: WO2011/105384
PCT Pub. Date: Sep. 1, 2011

(65) Prior Publication Data
US 2012/0322009 A1 Dec. 20, 2012

(30) Foreign Application Priority Data

Feb. 26, 2010 (JP) ................................. 2010-043130

(51) Int. Cl.
*G03F 7/00* (2006.01)
*G03F 7/26* (2006.01)
*B41M 1/00* (2006.01)
*B41N 1/00* (2006.01)
*G03F 7/32* (2006.01)

(52) U.S. Cl.
CPC . *G03F 7/322* (2013.01); *G03F 7/32* (2013.01)
USPC ........ 430/302; 430/270.1; 430/309; 101/453; 101/465

(58) Field of Classification Search
CPC ........... G03F 7/322; G03F 7/11; G03F 7/168; G03F 7/00; B41C 2201/02
USPC ............. 430/270.1, 302, 454; 101/453, 463.1
See application file for complete search history.

(56) References Cited

U.S. PATENT DOCUMENTS

2002/0092436 A1 7/2002 Tsuchiya et al.
2004/0096777 A1 5/2004 Tsuchiya et al.
(Continued)

FOREIGN PATENT DOCUMENTS

CN 102117020 A 7/2011
JP 200291016 A 3/2002
(Continued)

OTHER PUBLICATIONS

International Search Report (PCT/ISA/210) issued by the International Searching Authority in corresponding International Application No. PCT/JP2011/053871 on Mar. 22, 2011.

(Continued)

*Primary Examiner* — Chanceity Robinson
(74) *Attorney, Agent, or Firm* — Sughrue Mion, PLLC

(57) ABSTRACT

By a method of preparing a lithographic printing plate having exposing a lithographic printing plate precursor including a photosensitive layer containing (A) a polymerization initiator, (B) a polymerizable compound, (C) a sensitizing dye and (D) a binder polymer and a protective layer in this order on a hydrophilic support with laser and then removing the protective layer and an unexposed area of the photosensitive layer in the presence of a developer, in which the developer is a developer which has pH of from 2 to less than 10 and contains an amphoteric surfactant and a nonionic surfactant having an alkylene oxide chain, a simple processing of one solution and one step which does not require a water washing step becomes possible, excellent development property is achieved and a lithographic printing plate which has good printing durability and does not cause printing stain can be provided.

19 Claims, 1 Drawing Sheet

(56) References Cited

U.S. PATENT DOCUMENTS

| | | |
|---|---|---|
| 2008/0081295 A1 | 4/2008 | Adachi |
| 2010/0190110 A1 | 7/2010 | Strehmel et al. |
| 2011/0020757 A1* | 1/2011 | Kawauchi et al. ............ 430/401 |
| 2011/0159437 A1 | 6/2011 | Inno |
| 2012/0021358 A1* | 1/2012 | Taguchi et al. ............... 430/302 |

FOREIGN PATENT DOCUMENTS

| | | | |
|---|---|---|---|
| JP | 2003005381 A | | 1/2003 |
| JP | 2003107683 A | | 4/2003 |
| JP | 2004077589 A | * | 3/2004 |
| JP | 2008203359 A | | 9/2008 |
| JP | 2008276166 A | | 11/2008 |
| JP | 200947927 A | | 3/2009 |
| WO | 2009024592 A1 | | 2/2009 |
| WO | WO 2009024592 A1 | * | 2/2009 |
| WO | 2009-119610 A1 | | 10/2009 |
| WO | WO 2009119610 A1 | * | 10/2009 |
| WO | 2010-061869 A1 | | 6/2010 |

OTHER PUBLICATIONS

Written Opinion (PCT/ISA/237) issued by the International Searching Authority in corresponding International Application No. PCT/JP2011/053871 on Mar. 22, 2011.
Office Action dated Oct. 30, 2012 in Japanese Application No. 2010-043130.
Office Action dated Dec. 26, 2013, issued by the State Intellectual Property Office of the People's Republic of China in counterpart Chinese Application No. 201180011006.3.
Office Action dated Aug. 11, 2014 issued by the State Intellectual Property Office of P.R. China in corresponding Chinese Application No. 201180011006.3.
Office Action issued by the Australian Patent Office on Oct. 9, 2014, in corresponding Australian Application No. 2011221304.

* cited by examiner

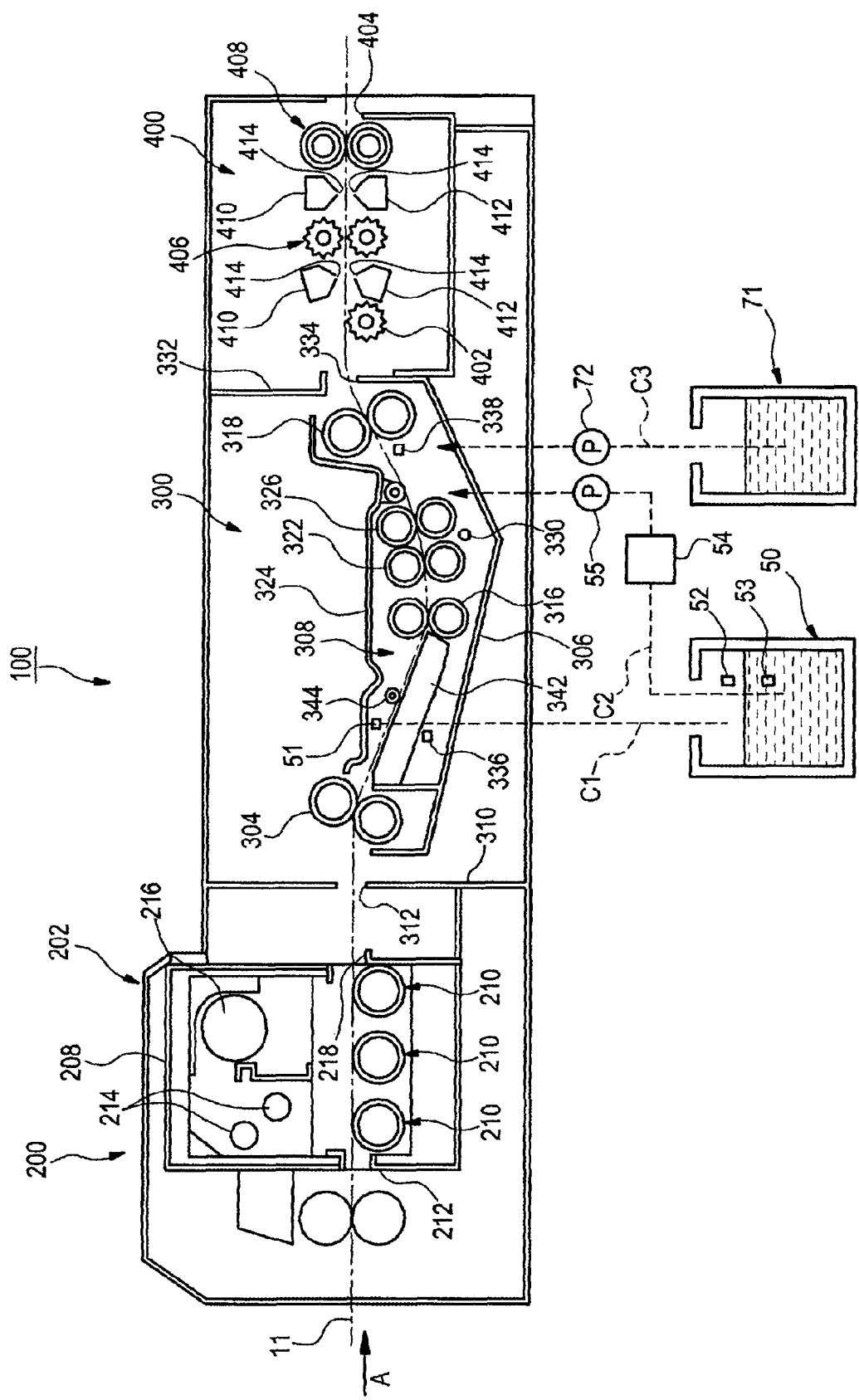

METHOD OF PREPARING LITHOGRAPHIC PRINTING PLATE AND DEVELOPER FOR LITHOGRAPHIC PRINTING PLATE PRECURSOR

TECHNICAL FIELD

The present invention relates to a method of preparing a lithographic printing plate, particularly, to a method of preparing a lithographic printing plate which enables conducting a simple processing which does not require a water washing step.

BACKGROUND ART

In general, a lithographic printing plate is composed of an oleophilic image area accepting ink and a hydrophilic non-image area accepting dampening water in the process of printing. Lithographic printing is a printing method which comprises rendering the oleophilic image area of the lithographic printing plate to an ink-receptive area and the hydrophilic non-image area thereof to a dampening water-receptive area (ink unreceptive area), thereby making a difference in adherence of ink on the surface of the lithographic printing plate, and depositing the ink only on the image area by utilizing the nature of water and printing ink to repel with each other, and then transferring the ink to a printing material, for example, paper.

In order to prepare the lithographic printing plate, a lithographic printing plate precursor (PS plate) comprising a hydrophilic support having provided thereon an oleophilic photosensitive resin layer (also referred to as a photosensitive layer or an image-recording layer) has heretofore been broadly used. Ordinarily, the lithographic printing plate is obtained by a plate making method comprising exposing the lithographic printing plate precursor through an original, for example, a lith film, and then while leaving the image-recording layer in the portion for forming the image area, removing the unnecessary image-recording layer other than the image area by dissolving with an alkaline developer or an organic solvent thereby revealing the hydrophilic surface of support to form the non-image area.

In recent years, digitalized technique of electronically processing, accumulating and outputting image information using a computer has been popularized, and various new image outputting systems responding to the digitalized technique have been put into practical use. Correspondingly, attention has been drawn to a computer-to-plate (CTP) technique of carrying digitalized image information on highly converging radiation, for example, laser light and conducting scanning exposure of a lithographic printing plate precursor with the light thereby directly preparing a lithographic printing plate without using a lith film. Thus, it is one of important technical subjects to obtain a lithographic printing plate precursor adaptable to the technique described above.

Also, in the plate making process of lithographic printing plate precursor, after exposure, the step of removing the unnecessary portion of the image-recording layer by dissolving with a developer or the like is required. Heretofore, the development processing process comprises three steps of developing with an aqueous strong alkali solution having pH exceeding 11, washing of the alkali agent with a water washing bath and then treating with a gum solution mainly comprising a hydrophilic resin. Therefore, the development system with the alkali agent has various problems in view of environment and running cost, for example, in that an automatic development processor per se requires a large space, in that it is necessary to provide a replenishment apparatus for supplementing decrease in the pH caused by absorption of carbon dioxide, and in that the load on disposal of a large amount of waste liquid, for example, development waste liquid, water washing waste liquid or gum waste liquid is large.

Particularly, since disposal of waste liquid discharged accompanying the development processing has become a great concern throughout the field of industry in view of the consideration for global environment in recent years, the decrease in alkali concentration of developer and the simplification of processing step have been further strongly required from aspects of the safety, consideration for global environment, space saving and low running cost.

Thus, as a method of preparing a lithographic printing plate using an alkali developer having relatively low pH, a method of developing a photosensitive lithographic printing plate with a developer having pH from 10.0 to 12.5 and containing an inorganic alkali agent and a nonionic surfactant containing a polyoxyalkylene ether group is proposed in Patent Document 1. However, this method has a problem in that an image-formation can not be sufficiently performed when the pH of developer is lower than 10.0.

Also, it is ordinarily difficult to ensure development property in the development processing in a range from acidity, neutrality to low alkalinity. Moreover, the component of photosensitive layer in the non-image area once removed is not easy to be dispersed in the developer. In particular, the component included in the polymerizable photosensitive layer, especially, the polymerizable compound is difficult to dissolve or disperse in the developer. Accordingly, when the development processing of lithographic printing plate precursor is repeatedly conducted, development scum derived from the polymerizable compound floats or accumulates in a developing bath not only to contaminate the development processor but also to adhere onto the lithographic printing plate precursor during the development processing, thereby causing a problem in that when the resulting lithographic printing plate is used for printing, printing satin or image defect may be apt to occur.

In response to the problem, a method of preparing a lithographic printing plate using a developer having pH from 2 to 10 and containing an amphoteric surfactant is proposed (see Patent Documents 2 to 4). However, this method is insufficient in the development property and does not solve the problem of the occurrence of printing stain.

PRIOR ART DOCUMENT

Patent Document

Patent Document 1: JP-A-2002-91016
Patent Document 2: JP-A-2008-203359
Patent Document 3: JP-A-2008-276166
Patent Document 4: JP-A-2009-47927

DISCLOSURE OF THE INVENTION

Problems that the Invention is to Solve

Accordingly, an object of the invention is to provide a method of preparing a lithographic printing plate which overcomes the drawbacks of the prior art, specifically to provide a method of preparing a lithographic printing plate which enables conducting a simple processing of one solution and one step which does not require a water washing step, exhibits excellent development property and can provide a lithographic printing plate which has good printing durability and does not cause printing stain.

Means for Solving the Problems

It has been found that the problems described above can be solved by the constitution shown below.

(1) A method of preparing a lithographic printing plate comprising exposing a lithographic printing plate precursor comprising a photosensitive layer containing (A) a polymerization initiator, (B) a polymerizable compound, (C) a sensitizing dye and (D) a binder polymer and a protective layer in this order on a hydrophilic support with laser and then removing the protective layer and an unexposed area of the photosensitive layer in the presence of a developer, wherein the developer is a developer which has pH from 2 to less than 10 and contains an amphoteric surfactant and a nonionic surfactant having an alkylene oxide chain.

(2) The method of preparing a lithographic printing plate as described in (1) above, wherein the amphoteric surfactant is at least one amphoteric surfactant represented by formula (1) or (2) shown below.

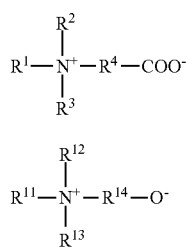

In formulae (1) and (2), $R^1$ and $R^{11}$ each independently represents an alkyl group having from 8 to 20 carbon atoms or an alkyl group having a connecting group which has from 8 to 20 carbon atoms in total, $R^2$, $R^3$, $R^{12}$ and $R^{13}$ each independently represents a hydrogen atom, an alkyl group or a group containing an ethyleneoxide group, $R^4$ and $R^{14}$ each independently represents a single bond or an alkylene group, two groups of $R^1$, $R^2$, $R^3$ and $R^4$ may be combined with each other to form a ring structure, and two groups of $R^{11}$, $R^{12}$, $R_{13}$ and $R^{14}$ may be combined with each other to form a ring structure.

(3) The method of preparing a lithographic printing plate as described in (2) above, wherein a sum of carbon atoms in $R^1$ to $R^4$ or a sum of carbon atoms in $R^{11}$ to $R^{14}$ is from 10 to 40.

(4) The method of preparing a lithographic printing plate as described in any one of (1) to (3) above, wherein the nonionic surfactant having an alkylene oxide chain is at least one nonionic aromatic ether surfactant represented by formula (3) shown below.

In formula (3), X represents an aromatic group, Y represents single bond or an alkylene group having from 1 to 10 carbon atoms, A and B, which are different from each other, each represents —CH$_2$CH$_2$O— or —CH$_2$CH(CH$_3$)O—, and n and m each represents an integer from 0 to 100, provided that a sum of n and m is 2 or more.

(5) The method of preparing a lithographic printing plate as described in any one of (1) to (4) above, wherein the developer further contains a pH buffer agent.

(6) The method of preparing a lithographic printing plate as described in (5) above, wherein the pH buffer agent is a carbonate ion and a hydrogen carbonate ion.

(7) The method of preparing a lithographic printing plate as described in (5) above, wherein the pH buffer agent is a water-soluble amine compound and an ion of the amine compound.

(8) The method of preparing a lithographic printing plate as described in any one of (1) to (7) above, wherein the developer further contains a water-soluble polymer compound.

(9) The method of preparing a lithographic printing plate as described in any one of (1) to (8) above, wherein (B) the polymerizable compound has a urethane bond or a urea bond.

(10) The method of preparing a lithographic printing plate as described in any one of (1) to (9) above, wherein (D) the binder polymer is a polyurethane resin having an acid group.

(11) The method of preparing a lithographic printing plate as described in any one of (1) to (10) above, wherein a ratio of a weight of (B) the polymerizable compound to a weight of (D) the binder polymer contained in the photosensitive layer is from 1.25 to 4.5.

(12) The method of preparing a lithographic printing plate as described in any one of (1) to (11) above, which does not contain a water washing step.

(13) A developer for lithographic printing plate precursor which has pH from 2 to less than 10 and contains an amphoteric surfactant represented by formula (1) or (2) shown below and a nonionic aromatic ether surfactant represented by formula (3) shown below.

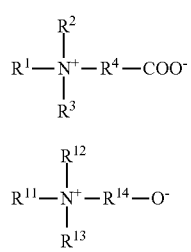

In formulae (1) and (2), $R^1$ and $R^{11}$ each independently represents an alkyl group having from 8 to 20 carbon atoms or an alkyl group having a connecting group which has from 8 to 20 carbon atoms in total, $R^2$, $R^3$, $R^{12}$ and $R^{13}$ each independently represents a hydrogen atom, an alkyl group or a group containing an ethyleneoxide group, $R^4$ and $R^{14}$ each independently represents a single bond or an alkylene group, two groups of $R^1$, $R^2$, $R^3$ and $R^4$ may be combined with each other to form a ring structure, and two groups of $R^{11}$, $R^{12}$, $R^{13}$ and $R^{14}$ may be combined with each other to form a ring structure.

In formula (3), X represents an aromatic group, Y represents single bond or an alkylene group having from 1 to 10 carbon atoms, A and B, which are different from each other, each represents —CH$_2$CH$_2$O— or —CH$_2$CH(CH$_3$)O—, and n and m each represents an integer from 0 to 100, provided that a sum of n and m is 2 or more.

(14) The developer for lithographic printing plate precursor as described in (13) above, wherein a sum of carbon atoms in $R^1$ to $R^4$ or a sum of carbon atoms in $R^{11}$ to $R^{14}$ is from 10 to 40.

(15) The developer for lithographic printing plate precursor as described in (13) or (14) above, wherein the developer further contains a pH buffer agent.
(16) The developer for lithographic printing plate precursor as described in (15) above, wherein the pH buffer agent is a carbonate ion and a hydrogen carbonate ion.
(17) The developer for lithographic printing plate precursor as described in (15) above, wherein the pH buffer agent is a water-soluble amine compound and an ion of the amine compound.
(18) The developer for lithographic printing plate precursor as described in any one of (13) to (17) above, wherein the developer further contains a water-soluble polymer compound.

Advantage of the Invention

According to the present invention, a method of preparing a lithographic printing plate which enables conducting a simple processing of one solution and one step which does not require a water washing step, exhibits excellent development property free from residue of the photosensitive layer in the non-image area and resolves the problem caused by development scum derived from the component (particularly, polymerizable compound) of photosensitive layer which has been removed by the development and is present in the developer is provided. Also, according to the method of preparing a lithographic printing plate of the invention, a lithographic printing plate having good stain resistance in the non-image area and good printing durability in the image area is obtained.

BRIEF DESCRIPTION OF THE DRAWING

FIG. 1 is a view schematically showing a structure of an automatic development processor.

MODE FOR CARRYING OUT THE INVENTION

The method of preparing a lithographic printing plate according to the invention comprises exposing a lithographic printing plate precursor comprising a photosensitive layer containing (A) a polymerization initiator, (B) a polymerizable compound, (C) a sensitizing dye and (D) a binder polymer and a protective layer in this order on a hydrophilic support with laser and then removing the protective layer and an unexposed area of the photosensitive layer in the presence of a developer, wherein the developer which has pH from 2 to less than 10 and contains an amphoteric surfactant and a nonionic surfactant having an alkylene oxide chain.

In the developer according to the invention, it is believed that the nonionic surfactant having an alkylene oxide chain accelerates solubility of the photosensitive layer in the non-image area and mainly gets involved in the removal of the photosensitive layer from the lithographic printing plate precursor and the amphoteric surfactant mainly gets involved in dispersion of the component of photosensitive layer in the developer. By using the nonionic surfactant having an alkylene oxide chain together with the amphoteric surfactant, good development property is obtained and it is possible to inhibit the occurrence of development scum in the developer. By using the nonionic surfactant having an alkylene oxide chain alone, although good development property is obtained, inhibition of the occurrence of development scum is insufficient. By using the amphoteric surfactant alone, although inhibition of the occurrence of development scum is achieved, the development property becomes insufficient.

In the components of the developer, the nonionic surfactant having an alkylene oxide chain gets involved in solubility of the binder polymer and it is particularly effective when the binder polymer is a urethane resin. Also, the amphoteric surfactant gets involved in dispersibility of the polymerizable compound in the developer and it is particularly effective when the polymerizable compound is a compound having a urethane bond or a urea bond.

Moreover, in the simple processing of one solution and one step which does not require a water washing step and is a preferred embodiment according to the invention, since it is necessary for the component of the protective layer to be dissolved or dispersed in the developer, inhibition of the development scum becomes more difficult, but the developer according to the invention also exhibits a good result in this embodiment.

First, the lithographic printing plate precursor for use in the method of preparing a lithographic printing plate according to the invention is described below.

[Lithographic Printing Plate Precursor]

The lithographic printing plate precursor according to the invention comprises a photosensitive layer containing (A) a polymerization initiator, (B) a polymerizable compound, (C) a sensitizing dye and (D) a binder polymer and a protective layer in this order on a hydrophilic support (A) Polymerization Initiator The photosensitive layer contains a polymerization initiator (hereinafter, also referred to as an initiator compound). In the invention, a radical polymerization initiator is preferably used.

As the initiator compound, initiator compounds known to those skilled in the art can be used without limitation. Specifically, the initiator compound includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound, an onium salt compound and a iron arene complex. Among them, at least one compound selected from the hexaarylbiimidazole compound, onium salt compound, trihalomethyl compound and metallocene compound is preferred, and the hexaarylbiimidazole compound is particularly preferred. Two or more kinds of the polymerization initiator may be appropriately used in combination.

The hexaarylbiimidazole compound includes, for example, lophine dimers described in European Patents 24,629 and 107,792 and U.S. Pat. No. 4,410,621, specifically, 2,2'-bis(o-chlorophenyl)-4,4',5,5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl)biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and
2,2'-bis(o-trifluoromethylphenyl)-4,4',5,5'-tetraphenylbiimidazole.

The hexaarylbiimidazole compound is particularly preferably used together with a sensitizing dye having an absorption maximum in a wavelength range from 300 to 450 nm.

The onium salt compound preferably includes a sulfonium salt, an iodonium salt and a diazonium salt. Particularly, a diaryliodonium salt or a triarylsulfonium salt is preferably used.

The onium salt compound is particularly preferably used together with an infrared absorbing agent having an absorption maximum in a wavelength range from 750 to 1,400 nm.

As other polymerization initiators, polymerization initiators described in Paragraph Nos. [0071] to [0129] of JP-A-2007-206217 are preferably used.

The polymerization initiators are preferably used individually or in combination of two or more thereof.

The amount of the polymerization initiator used in the photosensitive layer is preferably from 0.01 to 20% by weight, more preferably from 0.1 to 15% by weight, still more preferably from 1.0 to 10% by weight, based on the total solid content of the photosensitive layer.

(B) Polymerizable Compound

The photosensitive layer contains a polymerizable compound. The polymerizable compound is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group, with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described, for example, in JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2=C(R_4)COOCH_2CH(R_5)OH \quad (A)$$

(wherein $R_4$ and $R_5$ each independently represents H or $CH_3$.)

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Also, a photo-oxidizable polymerizable compound described in JP-T-2007-506125 is preferred and a polymerizable compound containing at least one urea group and/or tertiary amino group is particularly preferred. Specifically, a compound set forth below is exemplified.

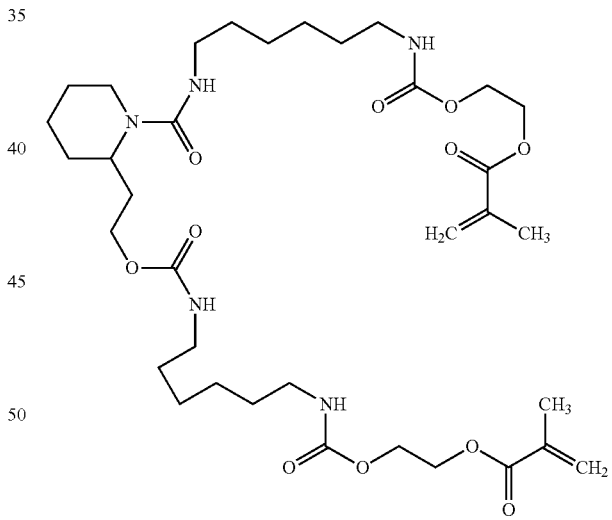

Details of the method of using the polymerizable compound, for example, the structure thereof, individual or combination use or the amount thereof added, can be appropriately determined in accordance with the characteristic design of the final lithographic printing plate precursor. The polymerizable compound is used preferably in a range from 5 to 75% by weight, more preferably in a range from 25 to 70% by weight, particularly preferably in a range from 30 to 60% by weight, based on the total solid content of the photosensitive layer.

Of the polymerizable compounds, a polymerizable compound having a urethane bond or a urea bond in its molecule, which has a high interaction property with the amphoteric surfactant contained in the developer according to the invention is particularly preferred in view of effective exhibition of the effect of the invention.

(C) Sensitizing Dye

The photosensitive layer contains a sensitizing dye. The sensitizing dye can be used without particular restriction as far as it absorbs light at the image exposure to form the excited state and provides energy to the polymerization initiator with electron transfer, energy transfer or heat generation thereby improving the polymerization initiation function. Particularly, a sensitizing dye having an absorption maximum in a wavelength range from 300 to 450 nm or from 750 to 1,400 nm is preferably used.

Examples of the sensitizing dye having an absorption maximum in a wavelength range from 300 to 450 nm include merocyanines, benzopyranes, coumarins, aromatic ketones, anthracenes, styryls and oxazoles.

Of the sensitizing dyes having an absorption maximum in a wavelength range from 300 to 450 nm, a dye represented by formula (IX) shown below is more preferred in view of high sensitivity.

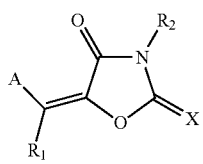

(IX)

In formula (IX), A represents an aryl group which may have a substituent or a heteroaryl group which may have a substituent, X represents an oxygen atom, a sulfur atom or =N($R_3$), and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a monovalent non-metallic atomic group, preferably a hydrogen atom, a substituted or unsubstituted alkyl group, a substituted or unsubstituted alkenyl group, a substituted or unsubstituted aryl group, a substituted or unsubstituted heteroaryl group, a substituted or unsubstituted alkoxy group, a substituted or unsubstituted alkylthio group, a hydroxy group or a halogen atom.

The aryl group which may have a substituent and heteroaryl group which may have a substituent represented by A in formula (IX) are same as the substituted or unsubstituted aryl group and substituted or unsubstituted heteroaryl group described for any one of $R_1$, $R_2$ and $R_3$, respectively.

Specific examples of such a sensitizing dye preferably used include compounds described in Paragraph Nos. [0047] to [0053] of JP-A-2007-58170, Paragraph Nos. [0036] to [0037] of JP-A-2007-93866 and Paragraph Nos. [0042] to [0047] of JP-A-2007-72816.

Further, sensitizing dyes described in JP-A-2006-189604, JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range from 750 to 1,400 nm (hereinafter, also referred to as an "infrared absorbing agent") is described. The infrared absorbing agent used is preferably a dye or a pigment.

As the dye, commercially available dyes and known dyes described in literatures, for example, *Senryo Binran*, compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. Further, cyanine dyes and indolenine cyanine dyes are more preferred. As particularly preferred examples of the dye, cyanine dyes represented by formula (a) shown below are exemplified.

Formula (a)

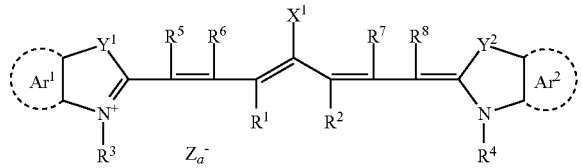

In formula (a), $X^1$ represents a hydrogen atom, a halogen atom, —$NPh_2$, $X^2$-$L^1$ or a group shown below. $X^2$ represents an oxygen atom, a nitrogen atom or a sulfur atom, $L^1$ represents a hydrocarbon group having from 1 to 12 carbon atoms, an aryl group containing a hetero atom (a nitrogen atom, a sulfur atom, an oxygen atom, a halogen atom or a selenium atom) or a hydrocarbon group having from 1 to 12 carbon atoms and containing a hetero atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

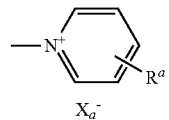

$R^1$ and $R^2$ each independently represents a hydrocarbon group having from 1 to 12 carbon atoms. In view of the preservation stability of a coating solution for photosensitive layer, it is preferred that $R^1$ and $R^2$ each represents a hydrocarbon group having two or more carbon atoms. Also, $R^1$ and $R^2$ may be combined with each other to form a ring and in case of forming the ring, it is particularly preferred to form a 5-membered or 6-membered ring.

$Ar^1$ and $Ar^2$, which may be the same or different, each represents an aromatic ring which may have a substituent. Preferred examples of the aromatic ring include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. From the standpoint of the availability of raw materials, a hydrogen atom is preferred.

$Za^-$ represents a counter anion. However, $Za^-$ is not necessary when the cyanine dye represented by formula (a) has an anionic substituent in the structure thereof and the neutralization of charge is not needed. Preferred examples of $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for photosensitive layer.

Specific examples of the cyanine dye represented by formula (a) used include compounds described in Paragraph Nos. [0017] to [0019] of JP-A-2001-133969, Paragraph Nos. [0016] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and particularly preferably compounds described in Paragraph Nos. [0035] to [0043] of JP-A-2007-90850.

Further, compounds described in Paragraph Nos. [0008] to [0009] of JP-A-5-5005 and Paragraph Nos. [0022] to [0025] of JP-A-2001-222101 are also preferably used.

The infrared absorbing dyes may be used only one kind or in combination of two or more kinds thereof and may be used together with an infrared absorbing agent other than the infrared absorbing dye, for example, a pigment. As the pigment, compounds described in Paragraph Nos. [0072] to [0076] of JP-A-2008-195018 are preferred.

The amount of the sensitizing dye added is preferably in a range from 0.05 to 30 parts by weight, more preferably from 0.1 to 20 parts by weight, particularly preferably from 0.2 to 10 parts by weight, per 100 parts by weight of the total solid content of the photosensitive layer.

(D) Binder Polymer

The photosensitive layer contains a binder polymer. As the binder polymer, a polymer capable of holding the components of photosensitive layer on a support and capable of being removed with the developer is used. The binder polymer used includes a (meth)acrylic polymer, a polyurethane resin, a polyvinyl alcohol resin, a polyvinyl butyral resin, a polyvinyl formal resin, a polyamide resin, a polyester resin and an epoxy resin. Particularly, a (meth)acrylic polymer, a polyurethane resin or a polyvinyl butyral resin is preferably used.

The term "(meth)acrylic polymer" as used herein means a copolymer containing as a polymerization component, (meth)acrylic acid or a (meth)acrylic acid derivative, for example, a (meth)acrylate (including, for example, an alkyl ester, aryl ester and allyl ester), (meth)acrylamide or a (meth)acrylamide derivative. The term "polyurethane resin" as used herein means a polymer formed by a condensation reaction of a compound having two or more isocyanate groups and a compound having two or more hydroxy groups. The term "polyvinyl butyral resin" as used herein means a polymer synthesized by a reaction (acetalization reaction) of polyvinyl alcohol obtained by partial or full saponification of polyvinyl acetate with butylaldehyde under an acidic condition and includes a polymer wherein an acid group or the like is introduced by a method of reacting the remaining hydroxy group with a compound having the acid group or the like.

One preferred example of the (meth)acrylic polymer according to the invention is a copolymer containing a repeating unit having an acid group. Examples of the acid group include a carboxylic acid group, a sulfonic acid group, a phosphonic acid group, a phosphoric acid group and a sulfonamido group. Particularly, a carboxylic acid group is preferred. As the repeating unit having an acid group, a repeating unit derived from (meth)acrylic acid or a repeating unit represented by formula (I) shown below is preferably used.

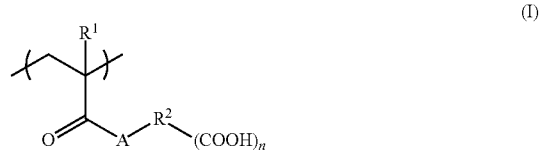

(I)

In formula (I), $R^1$ represents a hydrogen atom or a methyl group, $R^2$ represents a single bond or an (n+1) valent connecting group, A represents an oxygen atom or $-NR^3-$, wherein $R^3$ represents a hydrogen atom or a monovalent hydrocarbon group having from 1 to 10 carbon atoms, and n represents an integer from 1 to 5.

The connecting group represented by $R^2$ in formula (I) is constructed from a hydrogen atom, a carbon atom, an oxygen atom, a nitrogen atom, a sulfur atom and a halogen atom and a number of atoms included is preferably from 1 to 80. Specific examples of the connecting group include an alkylene group, a substituted alkylene group, an arylene group and a substituted arylene group. The connecting group may have a structure wherein a plurality of such divalent groups is connected to each other via any of an amido bond, an ether bond, a urethane bond, a urea bond and an ester bond. $R^2$ is preferably a single bond, an alkylene group, a substituted alkylene group or a structure where a plurality of an alkylene group and/or a substituted alkylene group is connected to each other via any of an amido bond, an ether bond, a urethane bond, a urea bond and an ester bond, particularly preferably a single bond, an alkylene group having from 1 to 5 carbon atoms, a substituted alkylene group having from 1 to 5 carbon atoms or a structure where a plurality of an alkylene group having from 1 to 5 carbon atoms and/or a substituted alkylene group having from 1 to 5 carbon atoms is connected to each other via any of an amido bond, an ether bond, a urethane bond, a urea bond and an ester bond, and most preferably a single bond, an alkylene group having from 1 to 3 carbon atoms, a substituted alkylene group having from 1 to 3 carbon atoms or a structure where a plurality of an alkylene group having from 1 to 3 carbon atoms and/or a substituted alkylene group having from 1 to 3 carbon atoms is connected to each other via any of an amido bond, an ether bond, a urethane bond, a urea bond and an ester bond.

Examples of the substituent include a monovalent nonmetallic atomic group exclusive of a hydrogen atom, for example, a halogen atom (e.g., $-F$, $-Br$, $-Cl$ or $-I$), a hydroxy group, a cyano group, an alkoxy group, an aryloxy group, a mercapto group, an alkylthio group, an arylthio group, an alkylcarbonyl group, an arylcarbonyl group, a carboxyl group and a conjugate base group thereof, an alkoxycarbonyl group, an aryloxycarbonyl group, a carbamoyl group, an aryl group, an alkenyl group and an alkynyl group.

$R^3$ is preferably a hydrogen atom or a hydrocarbon group having from 1 to 5 carbon atoms, particularly preferably a hydrogen atom or a hydrocarbon group having from 1 to 3 carbon atoms, and most preferably a hydrogen atom or a methyl group. n is preferably from 1 to 3, particularly preferably 1 or 2, and most preferably 1.

A ratio (% by mole) of the copolymerization component having a carboxylic acid group in the total copolymerization components of the (meth)acrylic polymer is preferably from 1 to 70% in view of development property. Considering good compatibility between the development property and printing durability, it is more preferably from 1 to 50%, and particularly preferably from 1 to 30%.

An acid value of the (meth)acrylic polymer is preferably from 10 to 250 mg-KOH/g.

It is preferred that the (meth)acrylic polymer for use in the invention further contain a crosslinkable group. The term "crosslinkable group" as used herein means a group capable of crosslinking the binder polymer in the process of a radical polymerization reaction which is caused in the photosensitive layer, when the lithographic printing plate precursor is exposed to light. The crosslinkable group is not particularly restricted as long as it has such a function and includes, for example, an ethylenically unsaturated bond group, an amino group and an epoxy group as a functional group capable of undergoing an addition polymerization reaction. Also, a functional group capable of forming a radical upon irradiation with light may be used and such a crosslinkable group includes, for example, a thiol group and a halogen atom. Among them, the ethylenically unsaturated bond group is preferred. The ethylenically unsaturated bond group preferably includes a styryl group, a (meth)acryloyl group and an allyl group.

In the polymer, for example, a free radical (a polymerization initiating radical or a propagating radical in the process of polymerization of the polymerizable compound) is added to the crosslinkable functional group to cause addition polymerization between the polymers directly or through a polymerization chain of the polymerizable compound and as a result, crosslinking is formed between the polymer molecules to effect curing. Alternatively, an atom (for example, a hydrogen atom on the carbon atom adjacent to the functional crosslinkable group) in the polymer is withdrawn by a free radical to produce a polymer radical and the polymer radicals combine with each other to form crosslinking between the polymer molecules to effect curing.

The content of the crosslinkable group (content of radical-polymerizable unsaturated double bond determined by iodine titration) in the (meth)acrylic polymer is preferably from 0.01 to 10.0 mmol, more preferably from 0.05 to 9.0 mmol, particularly preferably from 0.1 to 8.0 mmol, per g of the polymer.

The (meth)acrylic polymer for use in the invention may contain a polymerization unit of alkyl (meth)acrylate or aralkyl (meth)acrylate, a polymerization unit of (meth)acrylamide or a derivative thereof, a polymerization unit of α-hydroxymethyl acrylate or a polymerization unit of a styrene derivative, in addition to the polymerization unit having an acid group and the polymerization unit having a crosslinkable group described above. The alkyl group in the alkyl (meth)acrylate is preferably an alkyl group having from 1 to 5 carbon atoms or an alkyl group having from 2 to 8 carbon atoms and a substituent, for example, the substituent in the substituted alkylene group represented by $R^2$ described above, and more preferably a methyl group. The aralkyl (meth)acrylate includes, for example, benzyl (meth)acrylate. The (meth)acrylamide derivative includes, for example, N-isopropylacrylamide, N-phenylmethacrylamide, N-(4-methoxycarbonylphenyl)methacrylamide, N,N-dimethylacrylamide and morpholinoacrylamide. The α-hydroxymethyl acrylate includes, for example, ethyl α-hydroxymethyl acrylate and cyclohexyl α-hydroxymethyl acrylate. The styrene derivative includes, for example, styrene and 4-tret-butylstyrene.

Preferred examples of the polyurethane resin for use in the invention include polyurethane resins described in Paragraph Nos. [0099] to [0210] of JP-A-2007-187836, Paragraph Nos. [0019] to [0100] of JP-A-2008-276155, Paragraph Nos. [0018] to [0107] of JP-A-2005-250438 and Paragraph Nos. [0021] to [0083] of JP-A-2005-250158.

Preferred examples of the polyvinyl butyral resin for use in the invention include polyvinyl butyral resins described in Paragraph Nos. [0006] to [0013] of JP-A-2001-75279.

As is the case in the (meth)acrylic polymer, the polyurethane resin or polyvinyl butyral resin also preferably has an acid group, for example, a carboxylic acid group and more preferably further has a crosslinkable group, for example, an ethylenically unsaturated group. Preferred ranges of the acid value and the content of the crosslinkable group are same as those in the (meth)acrylic polymer described above.

The polyurethane resin having a urethane bond, which has a high interaction property with the amphoteric surfactant contained in the developer according to the invention is particularly preferred in view of effective exhibition of the effect of the invention.

A part of the acid groups in the binder polymer may be neutralized with a basic compound. Examples of the basic compound include a compound containing a basic nitrogen, an alkali metal hydroxide and a quaternary ammonium hydroxide.

The binder polymer preferably has a weight average molecular weight of 5,000 or more, more preferably from 10,000 to 300,000, and a number average molecular weight of 1,000 or more, more preferably from 2,000 to 250,000. The polydispersity (weight average molecular weight/number average molecular weight) is preferably from 1.1 to 10.

The binder polymers may be used individually or in combination of two or more thereof. The content of the binder polymer is preferably from 5 to 75% by weight, more preferably from 10 to 70% by weight, still more preferably from 10 to 60% by weight, based on the total solid content of the photosensitive layer from the standpoint of good strength of the image area and good image-forming property.

The total content of the polymerizable compound and the binder polymer is preferably 90% by weight or less based on the total solid content of the photosensitive layer. When it exceeds 90% by weight, decrease in the sensitivity and deterioration in the developing property may be caused sometimes. The total content thereof is more preferably from 35 to 80% by weight.

In general, as a ratio of a polymerizable compound to a binder polymer contained in a photosensitive layer of a lithographic printing plate precursor increases, permeability of a developer into the photosensitive layer more increases and the development property is more improved. The weight ratio of polymerizable compound/binder polymer contained in the photosensitive layer of the lithographic printing plate precursor according to the invention is preferably 1.2 or more, more preferably from 1.25 to 4.5, and particularly preferably from 2 to 4. As for the developer according to the invention, since the dispersibility of the polymerizable compound in the developer is ensured by the amphoteric surfactant, the scum hardly occurs in the developer so that the range of high ratio of the polymerizable compound described above in which the development property is improved can be effectively employed.

The photosensitive layer preferably contains a chain transfer agent. The chain transfer agent is defined, for example, in Kobunshi Jiten, Third Edition, pages 683 to 684, edited by The Society of Polymer Science, Japan (2005). As the chain transfer agent, for example, compounds having SH, PH, SiH or GeH in their molecules are used. The compound donates a hydrogen to a low active radical species to generate a radical or is oxidized and then deprotonized to generate a radical. In the photosensitive layer according to the invention, a thiol compound (for example, a 2-mercaptobenzimidazole, a 2-mercaptobenzothiazole, a 2-mercaptobenzoxazole, a 3-mercaptotriazole or a 5-mercaptotetrazole) is preferably used. As preferred examples thereof, thiol compounds described in Paragraph Nos. [0097] to [0109] of JP-A-2007-58170 are exemplified.

The amount of the chain transfer agent added is preferably from 0.01 to 20 parts by weight, more preferably from 1 to 10 parts by weight, particularly preferably from 1 to 5 parts by weight, per 100 parts by weight of the total solid content of the photosensitive layer.

(Other Components for Photosensitive Layer)

Into the photosensitive layer, various additives can be further incorporated, if desired. Examples of the additive include a surfactant for progressing the development property and improving the surface state of coated layer, a microcapsule for providing good compatibility between development property and printing durability, a hydrophilic polymer for improving the development property and dispersion stability of microcapsule, a coloring agent or print-out agent for visually distinguishing the image area from the non-image area, a polymerization inhibitor for preventing undesirable thermal polymerization of the polymerizable compound during the production and preservation of the photosensitive layer, a hydrophobic low molecular weight compound, for example, a higher fatty acid derivative for avoiding polymerization inhibition due to oxygen, a fine inorganic particle or fine organic particle for increasing strength of the cured layer in the image area, a hydrophilic low molecular weight compound for improving the development property, a co-sensitizer for increasing sensitivity, and a plasticizer for improving plasticity. As the additives, known compounds, for example, compounds described in Paragraph Nos. [0161] to [0215] of JP-A-2007-206217, Paragraph No. [0067] of JP-T-2005-509192 and Paragraph Nos. [0023] to [0026] and [0059] to [0066] of JP-A-2004-310000 are used. With respect to the surfactant, surfactants which may be added to the developer described hereinafter may also be used.

<Formation of Photosensitive Layer>

The photosensitive layer is formed by dispersing or dissolving each of the necessary constituting components described above in a solvent to prepare a coating solution and coating the solution. The solvent used include, for example, methyl ethyl ketone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the photosensitive layer after the coating and drying is preferably from 0.3 to 3.0 g/m$^2$. Various methods can be used for the coating. Examples of the method include bar coater coating, spin coating, spray coating, curtain coating, dip coating, air knife coating, blade coating and roll coating.

[Protective Layer]

In the lithographic printing plate precursor according to the invention, a protective layer (oxygen-blocking layer) is provided on the photosensitive layer in order to block diffusion and penetration of oxygen which inhibits the polymerization reaction at the time of exposure. As a material for the protective layer, any water-soluble polymer and water-insoluble polymer can be appropriately selected to use. The polymers may be used in combination of two or more thereof, if desired. Specifically, for example, polyvinyl alcohol, a modified polyvinyl alcohol, polyvinyl pyrrolidone, a water-soluble cellulose derivative and poly(meth)acrylonitrile are exemplified. Among them, a water-soluble polymer relatively excellent in crystallizability is preferably used. Specifically, when polyvinyl alcohol is used as a main component, the most preferred results can be obtained in the fundamental characteristics, for example, oxygen-blocking property and removability by development.

Polyvinyl alcohol for use in the protective layer may be partially substituted with ester, ether or acetal as long as it contains unsubstituted vinyl alcohol units for achieving the necessary oxygen-blocking property and water solubility. Also, polyvinyl alcohol may partly have other copolymer component. Polyvinyl alcohol is obtained by hydrolysis of polyvinyl acetate. As specific examples of the polyvinyl alcohol, those having a hydrolysis degree ranging from 69.0 to 100% by mole and a polymerization repeating unit number ranging from 300 to 2,400 are exemplified. Specific examples thereof include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706 and L-8 (produced by Kuraray Co., Ltd.). The polyvinyl alcohols can be used individually or as a mixture. The content of polyvinyl alcohol in the protective layer is preferably from 20 to 95% by weight, and more preferably from 30 to 90% by weight.

Also, known modified polyvinyl alcohol can be preferably used. Particularly, an acid-modified polyvinyl alcohol having a carboxylic acid group or a sulfonic acid group is preferably used. Specifically, polyvinyl alcohols described in JP-A-2005-250216 and JP-A-2006-259137 are preferably exemplified.

When the polyvinyl alcohol is used as a mixture with other material, as the other material mixed, a modified polyvinyl alcohol, polyvinyl pyrrolidone or a modified product thereof is preferred from the viewpoint of the oxygen-blocking property and removability by development. The content thereof in the protective layer is ordinarily from 3.5 to 80% by weight, preferably from 10 to 60% by weight, and more preferably from 15 to 30% by weight.

As other component of the protective layer, glycerin, dipropylene glycol or the like can be added in an amount of several % by weight of the polymer to provide flexibility. Further, an anionic surfactant, for example, sodium alkylsulfate or sodium alkylsulfonate, an amphoteric surfactant, for example, alkylaminocarboxylate and alkylaminodicarboxylate, or a nonionic surfactant, for example, polyoxyethylene alkyl phenyl ether can be added in an amount of several % by weight of the polymer.

Further, it is also preferred to incorporate an inorganic stratiform compound into the protective layer for the purpose of improving the oxygen-blocking property and property for protecting the surface of photosensitive layer. Of the inorganic stratiform compounds, fluorine based swellable synthetic mica, which is a synthetic inorganic stratiform compound, is particularly useful. Specifically, inorganic stratiform compounds described in JP-A-2005-119273 are preferably exemplified.

The coating amount of the protective layer is preferably from 0.05 to 10 g/m² in terms of the coating amount after drying. When the protective layer contains the inorganic stratiform compound, it is more preferably from 0.1 to 5 g/m², and when the protective layer does not contain the inorganic stratiform compound, it is more preferably from 0.5 to 5 g/m².

<Support>

A support for use in the lithographic printing plate precursor according to the invention is not particularly restricted as long as it is a dimensionally stable plate-like hydrophilic support. Particularly, an aluminum plate is preferred. In advance of the use of an aluminum plate, the aluminum plate is preferably subjected to a surface treatment, for example, roughening treatment or anodizing treatment. The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively). With respect to the surface treatments, methods described in Paragraph Nos. [0241] to [0245] of JP-2007-206217 are preferably used.

The center line average roughness of the support is preferably from 0.10 to 1.2 μm. In the range described above, good adhesion property to the photosensitive layer and good printing durability and good resistance to stain are achieved.

The color density of the support is preferably from 0.15 to 0.65 in terms of the reflection density value. In the range described above, good image-forming property by preventing halation at the image exposure and good aptitude for plate inspection after development are achieved.

The thickness of the support is preferably from 0.1 to 0.6 mm, more preferably from 0.15 to 0.4 mm, and still more preferably from 0.2 to 0.3 mm.

(Hydrophilizing Treatment of Support and Undercoat Layer)

As for the lithographic printing plate precursor, in order to increase hydrophilicity of the non-image area and to prevent printing stain, it is preferred to conduct a hydrophilizing treatment of the surface of support or to provide an undercoat layer between the support and the photosensitive layer.

The hydrophilizing treatment of the surface of support includes an alkali metal silicate treatment method wherein the support is subjected to an immersion treatment or an electrolytic treatment in an aqueous solution, for example, of sodium silicate, a method of treating with potassium fluorozirconate and a method of treating with polyvinylphosphonic acid. An immersion treatment method in an aqueous polyvinylphosphonic acid solution is preferably used.

As the undercoat layer, an undercoat layer containing a compound having an acid group, for example, a phosphonic acid group, a phosphoric acid group or a sulfonic acid group is preferably used. It is preferred for the compound to further have a polymerizable group in order to increase the adhesion property to the photosensitive layer. As the polymerizable group, an ethylenically unsaturated bond group is preferred. Also, a compound further having a hydrophilicity-imparting group, for example, an ethyleneoxy group is exemplified as a preferred compound.

These compounds may be low molecular weight compounds or polymer compounds. These compounds may be used in combination of two or more thereof, if desired.

For example, a silane coupling agent having an addition-polymerizable ethylenically unsaturated bond group described in JP-A-10-282679 and a phosphorus compound having an ethylenically unsaturated bond group described in JP-A-2-304441 are preferably exemplified. It is also preferred to use a low molecular weight compound or polymer compound having a crosslinkable group (preferably an ethylenically unsaturated bond group), a functional group capable of interacting with the surface of support and a hydrophilic group described in JP-A-2005-238816, JP-A-2005-125749, JP-A-2006-239867 and JP-A-2006-215263.

The undercoat layer is coated according a known method. The coating amount (solid content) of the undercoat layer is preferably from 0.1 to 100 mg/m², and more preferably from 1 to 30 mg/m².

<Backcoat Layer>

A backcoat layer can be provided on the back surface (surface opposite to the surface provided with the photosensitive layer) of the support, if desired. The backcoat layer preferably includes, for example, a layer comprising an organic polymer compound described in JP-A-5-45885 and a coating layer comprising a metal oxide obtained by hydrolysis and polycondensation of an organic metal compound or inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting materials are inexpensive and easily available.

The method of preparing a lithographic printing plate according to the invention is described below.

[Method of Preparing Lithographic Printing Plate]

The lithographic printing plate precursor according to the invention is exposed imagewise and then subjected to development processing to prepare a lithographic printing plate.

<Image Exposure Step>

The lithographic printing plate precursor is exposed with laser through a transparent original having a line image, a halftone dot image or the like, or imagewise exposed by scanning of laser beam based on digital data.

The wavelength of the exposure light source is preferably from 300 to 450 nm or from 750 to 1,400 nm. In case of exposing with light of 300 to 450 nm, the lithographic printing plate precursor having a photosensitive layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source having a wavelength from 300 to 450 nm, a semiconductor laser is preferably used. As the light source having a wavelength from 750 to 1,400 nm, a solid laser or semiconductor laser emitting an infrared ray is preferably used. The exposure mechanism may be any of an internal drum system, an external drum system and a flat bed system.

<Development Processing Step>

The development processing in the method of preparing a lithographic printing plate according to the invention is characterized by conducting using a developer having pH from 2 to less than 10 and containing an amphoteric surfactant and a nonionic surfactant having an alkylene oxide chain.

Specifically, according to the method of preparing a lithographic printing plate of the invention, the protective layer and the unexposed area of the photosensitive layer can be removed together by the development processing described above. After the development processing, the printing plate obtained can be immediately mounted on a printing machine to perform printing.

According to the hitherto known development processing using an alkali developer, it is necessary that a protective layer is removed in a pre-water washing step, the alkali development is conducted, the alkali is removed by washing with water in a post-water washing step, gum solution treatment is conducted and drying is conducted in a drying step. On the contrary, in the development processing according to the invention, since the protective layer is removed at the same time, the pre-water washing step is not necessary. Further, the development and gum solution treatment step can be conducted at the same time by incorporating a water-soluble polymer compound into the developer, if desired. Thus, the post-water washing step is not particularly necessary, and after conducting the development and gum solution treatment in one solution and one step, the drying step can be performed. After the development processing, the excess developer is preferably removed using a squeeze roller, followed by drying.

One preferred embodiment of the method of preparing a lithographic printing plate according to the invention is characterized by not containing a water washing step. The term "not containing a water washing step" as used herein means that any water washing step is not involved between the image exposure step of a lithographic printing plate precursor and the completion of the preparation of a lithographic printing plate through the development processing step. Specifically, according to the embodiment, a lithographic printing plate is prepared without undergoing a water washing step not only between the image exposure step and the development processing step but also after the development processing step. The lithographic printing plate prepared can be used for printing as it is.

The development processing is performed at temperature from 0 to 60° C., preferably from about 15 to about 40° C. according to a conventional manner, for example, by a method wherein the imagewise exposed lithographic printing plate precursor is immersed in the developer and rubbed with a brush or a method wherein the developer is sprayed to the imagewise exposed lithographic printing plate precursor and the lithographic printing plate precursor is rubbed with a brush.

The development processing according to the invention is preferably performed by an automatic development processor equipped with a supplying means for the developer and a rubbing member. An automatic development processor using a rotating brush roller as the rubbing member is particularly preferred. The number of the rotating brush rollers is preferably two or more. Further, the automatic development processor is preferably provided with a means for removing the excess developer, for example, a squeeze roller, or a drying means, for example, a hot air apparatus, subsequently to the development processing means. Further, the automatic development processor may be provided with a pre-heating means for conducting pre-heating treatment of the lithographic printing plate precursor after image exposure prior to the development processing means.

The development processing by such an automatic development processor has an advantage in that it is free from the measures against development scum resulting from the protective layer and/or photosensitive layer encountered in a so-called on-press development.

One example of the automatic development processor for use in the method of preparing a lithographic printing plate according to the invention is briefly described with reference to FIG. 1.

An automatic development processor 100 shown in FIG. 1 comprises a chamber the outer shape of which is formed by a machine casing 202 and has a pre-heating unit 200, a developing unit 300 and a drying unit 400 continuously formed along a transporting direction (arrow A) of a transporting pass 11 for a lithographic printing plate precursor.

The pre-heating unit 200 comprises a heating chamber 208 having a transporting inlet 212 and a transporting outlet 218 and a skewer roller 210, a heater 214 and a circulation fan 216 are arranged in the inside thereof.

The developing unit 300 is separated from the pre-heating unit 200 by an outer panel 310 and a slit type insertion slot 312 is formed in the outer panel 310.

In the inside of the developing unit 300, a processing tank 306 having a developing tank 308 filled with a developer and an insertion roller pair 304 for guiding the lithographic printing plate precursor into the inside of the processing tank 306 are disposed. A shielding cover 324 is located above the developing tank 308.

In the inside of the developing tank 308, a guide roller 344 and a guide member 342, a submerged roller pair 316, a brush roller pair 322, a brush roller pair 326 and a carrying-out roller pair 318 are provided in order from the upstream side of the transporting direction of lithographic printing plate precursor. The lithographic printing plate precursor transported into the developing tank 308 is immersed in the developer and the non-image area is removed by passing between the rotating brush roller pairs 322 and 326.

A spray pipe 330 is provided under the brush roller pairs 322 and 326. The spray pipe 330 is connected to a pump (not shown) and the developer in the developing tank 308 sucked by the pump is ejected from the spray pipe 330 in the developing tank 308.

On a sidewall of the developing tank 308, an overflow aperture 51 is provided to form a top edge of a first circulation pipeline C1. The excess developer flows in the overflow aperture 51, passes through the first circulation pipeline C1 and is discharged in an external tank 50 provided outside the developing unit 300.

To the external tank 50 is connected a second circulation pipeline C2 and a filter unit 54 and a developer supply pump 55 are located in the second circulation pipeline C2. The developer is supplied from external tank 50 to the developing tank 308 by the developer supply pump 55. In the external tank 50, an upper limit liquid level meter 52 and a lower limit liquid level meter 53 are provided.

The developing tank 308 is also connected to a water tank for replenishment 71 through a third circulation pipeline C3. A water-replenishing pump 72 is located in the third circulation pipeline C3 and water pooled in the water tank for replenishment 71 is supplied to the developing bath 308 by the water-replenishing pump 72.

A liquid temperature sensor 336 is provided on the upstream side of the submerged roller pair 316. A liquid level meter 338 is provided on the upstream side of the carrying-out roller pair 318.

In a partition board 332 placed between the developing unit 300 and the drying unit 400, a slit type pass-through slot 334 is formed. Also, a shutter (not shown) is provided along a passage between the developing unit 300 and the drying unit 400 and the passage is closed by the shutter when the lithographic printing plate precursor does not pass through the passage.

In the drying unit 400, a support roller 402, ducts 410 and 412, a transport roller pair 406, ducts 410 and 412 and a transport roller pair 408 are disposed in this order. A slit hole 414 is provided at the top of each of the ducts 410 and 412. In the drying unit 400, a drying means (not shown), for example, a hot air supplying means or a heat generating means, is also provided. The drying unit 400 has a discharge slot 404 and the resulting lithographic printing plate dried by the drying means is discharged through the discharge slot 404.

The developer for use in the method of preparing a lithographic printing plate according to the invention is an aqueous solution having pH from 2 to less than 10 and containing an amphoteric surfactant and a nonionic surfactant having an alkylene oxide chain. The developer preferably contains water as the main component (containing 60% by weight or more of water). Further, it is preferred that the developer contains a water-soluble polymer compound or a pH buffer agent. The pH of the developer is preferably from 5 to less than 10, more preferably from 6 to less than 10, and particularly preferably from 6.8 to 9.9.

The amphoteric surfactant for use in the developer according to the invention is not particularly limited and includes, for example, amine oxide type, for example, an alkyldimethylamine oxide, betaine type, for example, an alkyl betaine, a fatty acid amide propyl betaine or an alkylimidazole, and amino acid type, for example, sodium salt of an alkylamino fatty acid.

In particular, an alkyldimethylamine oxide which may have a substituent, an alkyl carboxy betaine which may have a substituent and an alkyl sulfo betaine which may have a substituent are preferably used. Specific examples thereof include compounds represented by formula (2) described in Paragraph No. [0256] of JP-A-2008-203359, compounds represented by formula (I), formula (II) and formula (VI) described in Paragraph No. [0028] of JP-A-2008-276166, and compounds described in Paragraph Nos. [0022] to [0029] of JP-A-2009-47927.

As the amphoteric surfactant used in the developer, a compound represented by formula (1) shown below or a compound represented by formula (2) shown below is preferred.

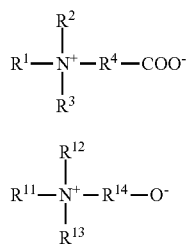

In formulae (1) and (2), $R^1$ and $R^{11}$ each independently represents an alkyl group having from 8 to 20 carbon atoms or an alkyl group having a connecting group which has from 8 to 20 carbon atoms in total.

$R^2$, $R^3$, $R^{12}$ and $R^{13}$ each independently represents a hydrogen atom, an alkyl group or a group containing an ethyleneoxide group.

$R^4$ and $R^{14}$ each independently represents a single bond or an alkylene group.

Also, two groups of $R^1$, $R^2$, $R^3$ and $R^4$ may be combined with each other to form a ring structure, and two groups of $R^{11}$, $R^{12}$, $R^{13}$ and $R^{14}$ may be combined with each other to form a ring structure.

In the compound represented by formula (1) or the compound represented by formula (2), as the total number of carbon atoms increases, the hydrophobic portion becomes larger and solubility of the compound in the aqueous developer decreases. In such a case, the solubility is improved by mixing with water, as a dissolution auxiliary agent, an organic solvent for assisting the dissolution, for example, an alcohol. However, when the total number of carbon atoms excessively increases, the surfactant can not be dissolved in the proper amount in some cases. Therefore, the sum of carbon atoms in $R^1$ to $R^4$ or $R^{11}$ to $R^{14}$ is preferably from 10 to 40, and more preferably from 12 to 30.

The alkyl group having a connecting group represented by $R^1$ or $R^{11}$ indicates a structure having a connecting group in the alkyl group. Specifically, when the connecting group is one, the alkyl group is represented by "-alkylene group-connecting group-alkyl group". The connecting group includes an ester bond, a carbonyl bond and an amido bond. Although the connecting groups may present two or more, one connecting group is preferred and an amido bond is particularly preferred. The total number of carbon atoms in the alkylene group bonding to the connecting group is preferably from 1 to 5. Although the alkylene group may be straight-chain or branched, it is preferably a straight-chain alkylene group. The alkyl group bonding to the connecting group preferably has from 3 to 19 carbon atoms and although it may be straight-chain or branched, it is preferably a straight-chain alkyl group.

When $R^2$ or $R^{12}$ represents an alkyl group, the total number of carbon atoms is preferably from 1 to 5, and particularly preferably from 1 to 3. Although the alkyl group may be straight-chain or branched, it is preferably a straight-chain alkyl group.

When $R^3$ or $R^{13}$ represents an alkyl group, the total number of carbon atoms is preferably from 1 to 5, and particularly preferably from 1 to 3. Although the alkyl group may be straight-chain or branched, it is preferably a straight-chain alkyl group.

The group containing an ethyleneoxide group represented by $R^2$, $R^{12}$, $R^3$ or $R^{13}$ includes a group represented by —Ra(CH$_2$CH$_2$O)$_n$Rb, wherein Ra represents a single bond, an oxygen atom or a divalent organic group (preferably an alkyleneoxy group having 10 or less carbon atoms, more preferably an alkyleneoxy group having 5 or less carbon atoms), Rb represents a hydrogen atom or an organic group (preferably an alkyleneoxy group having 10 or less carbon atoms, more preferably an alkyleneoxy group having 5 or less carbon atoms), and n represents an integer from 1 to 10.

When $R^4$ or $R^{14}$ represents an alkylene group, the total number of carbon atoms is preferably from 1 to 5, and particularly preferably from 1 to 3. Although the alkylene group may be straight-chain or branched, it is preferably a straight-chain alkylene group.

The compound represented by formula (1) or the compound represented by formula (2) preferably has an amido bond and more preferably has an amido bond as the connecting group in $R^1$ or $R^{11}$.

Representative examples of the compound represented by formula (1) or the compound represented by formula (2) are set forth below, but the invention should not be construed as being limited thereto.

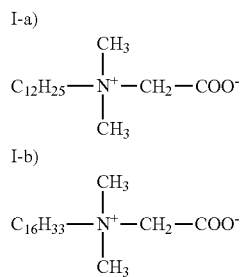

I-c) 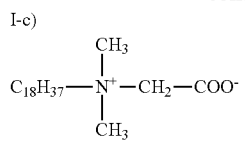

I-d) 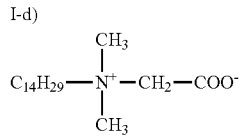

I-e) 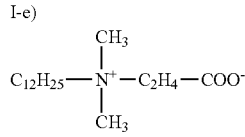

I-f) 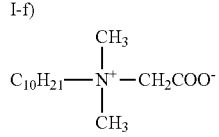

I-g) 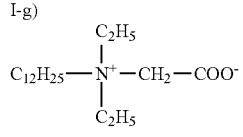

I-h) 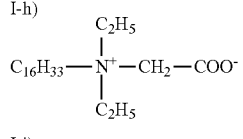

I-i) 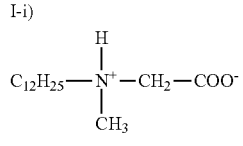

I-j) 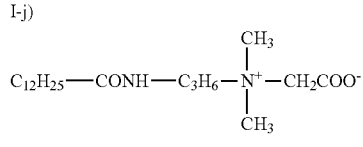

I-k) 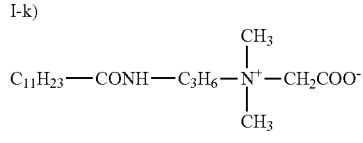

I-l) 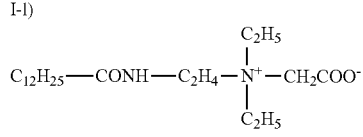

I-m) 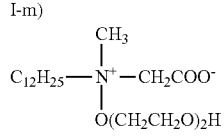

I-n) 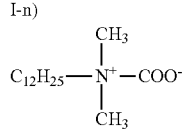

I-o) 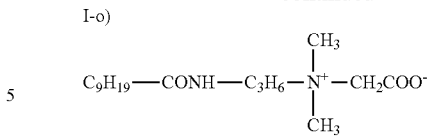

I-p) 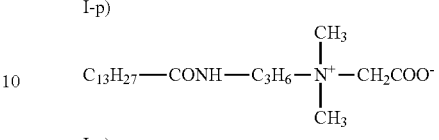

I-q) 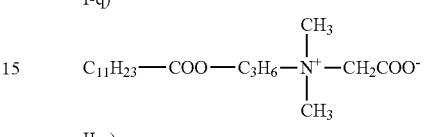

II-a) 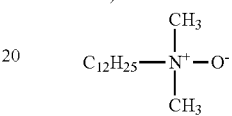

II-b) 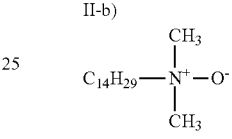

II-c) 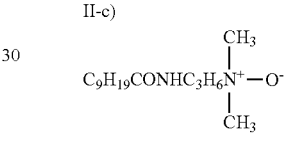

II-d) 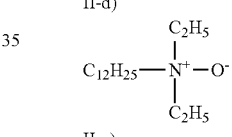

II-e) 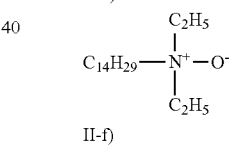

II-f) 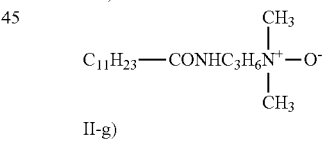

II-g) 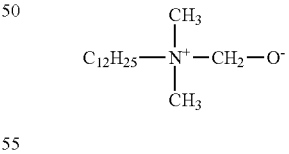

The compound represented by formula (1) or (2) can be synthesized according to a known method. Also, it is possible to use a commercial product. As the commercial product for the compound represented by formula (1), for example, SOFTAZOLINE LPB, SOFTAZOLINE LPB-R or VISTA MAP produced by Kawaken Fine Chemicals Co., Ltd. and TAKESURF C-157L produced by Takemoto Oil & Fat Co., Ltd. are exemplified. As the commercial product for the compound represented by formula (2), for example, SOFTAZOLINE LAO produced by Kawaken Fine Chemicals Co, Ltd. and AMOGEN AOL produced by Dai-ichi Kogyo Seiyaku Co., Ltd. are exemplified.

The amphoteric surfactants may be used one kind alone or in combination of two or more kinds in the developer.

The nonionic surfactant having an alkylene oxide chain for use in the developer according to the invention includes, for example, a polyoxyethylene alkyl ether, a polyoxyethylene alkylphenyl ether, polyoxyethylene polystyrylphenyl ether, a propylene glycol fatty acid monoester, a polyoxyethylenesorbitan fatty acid partial ester, a polyoxyethylenesorbitol fatty acid partial ester, a polyethylene glycol fatty acid ester, a polyoxyethyleneglycerin fatty acid partial ester, a polyoxyethylene diglycerin, a polyoxyethylene alkylamine, a polyoxyethylene alkylnaphthyl ether, a polyoxyethylene-polyoxypropylene block copolymer and an acetylene alcohol-based oxyethylene adduct. As the alkylene oxide chain, an ethylene oxide chain or a propylene oxide chain is preferred. The nonionic surfactants having an alkylene oxide chain may be used one kind alone or in combination of two or more kinds in the developer.

As the nonionic surfactant having an alkylene oxide chain, a nonionic aromatic ether surfactant represented by formula (3) shown below is particularly preferably exemplified.

$$X-Y-O-(A)_n-(B)_m-H \quad (3)$$

In formula (3), X represents an aromatic group, Y represents single bond or an alkylene group having from 1 to 10 carbon atoms, A and B, which are different from each other, each represents —$CH_2CH_2O$— or —$CH_2CH(CH_3)O$—, and n and m each represents an integer from 0 to 100, provided that a sum of n and m is 2 or more.

In formula (3), the aromatic group represented by X includes a phenyl group, a naphthyl group or an anthryl group. The aromatic group may have a substituent. The substituent includes an organic group having from 1 to 100 carbon atoms. Examples of the organic group are same as examples of the organic group described for formulae (3-A) and (3-B) shown below. In formula (3), when both A and B are present, they may be present at random or as a block.

The sum of n and m is preferably from 4 to 100, more preferably from 6 to 50, still more preferably from 8 to 30, and particularly preferably from 10 to 28.

Of the nonionic aromatic ether surfactants represented by formula (3), compounds represented by formula (3-A) or (3-B) shown below are preferred.

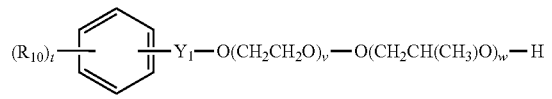
(3-A)

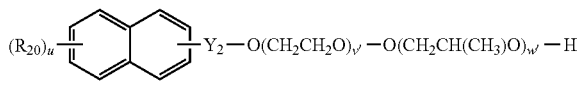
(3-B)

In formulae (3-A) and (3-B), $R_{10}$ and $R_{20}$ each represents a hydrogen atom or an organic group having from 1 to 100 carbon atoms, t and u each represents 1 or 2, $Y_1$ and $Y_2$ each represents a single bond or an alkylene group having from 1 to 10 carbon atoms, v and w each represents an integer from 0 to 100, provided that a sum of v and w is 2 or more, and v' and w' each represents an integer from 0 to 100, provided that a sum of v' and w' is 2 or more.

When t is 2 and $R_{10}$ represents an organic group having from 1 to 100 carbon atoms, two $R_{10}$ may be the same or different, or may be combined with each other to from a ring.

Also, when u is 2 and $R_{20}$ represents an organic group having from 1 to 100 carbon atoms, two $R_{20}$ may be the same or different, or may be combined with each other to from a ring.

The organic group having from 1 to 100 carbon atoms is preferably an organic group having from 1 to 50 carbon atoms, more preferably an organic group having from 1 to 25 carbon atoms, and specific examples thereof include a saturated or unsaturated, straight-chain or branched aliphatic hydrocarbon group or an aromatic hydrocarbon group (for example, an alkyl group, an alkenyl group, an alkynyl group, an aryl group or an aralkyl group), an alkoxy group, an aryloxy group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an acylamino group, an N-alkylacylamino group, an N-arylacylamino group, an acyl group, an alkoxycarbonylamino group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, a polyoxyalkylene chain, and the above-described organic groups to which a polyoxyalkylene chain is connected. The alkyl group described above may be a straight-chain or branched alkyl group.

Preferred examples of $R_{10}$ or $R_{20}$ include a hydrogen atom, a straight-chain or branched alkyl group having from 1 to 10 carbon atoms, an alkoxy group having from 1 to 10 carbon atoms, an alkoxycarbonyl group, an N-alkylamino group, an N,N-dialkylamino group, an N-alkylcarbamoyl group, an acyloxy group, an acylamino group, a polyoxyalkylene chain having a repeating unit number from about 5 to about 20, an aryl group having from 6 to 20 carbon atoms and an aryl group having a polyoxyalkylene chain having a repeating unit number from about 5 to about 20.

In the compounds represented by formula (3-A) or (3-B), a repeating unit number of the polyoxyethylene chain is preferably from 3 to 50, and more preferably from 5 to 30. A repeating unit number of the polyoxypropylene chain is preferably from 0 to 10, and more preferably from 0 to 5. The polyoxyethylene part and polyoxypropylene part may be present at random or as a block.

Specific examples of the nonionic aromatic ether surfactant represented by formula (3) are set forth below, but the invention should not be construed as being limited thereto.

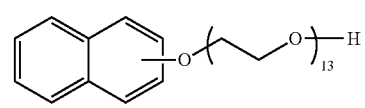
Y-1

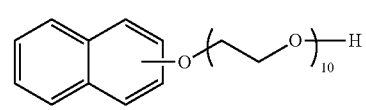
Y-2

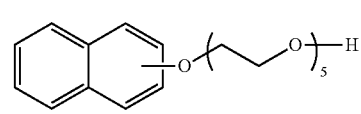
Y-3

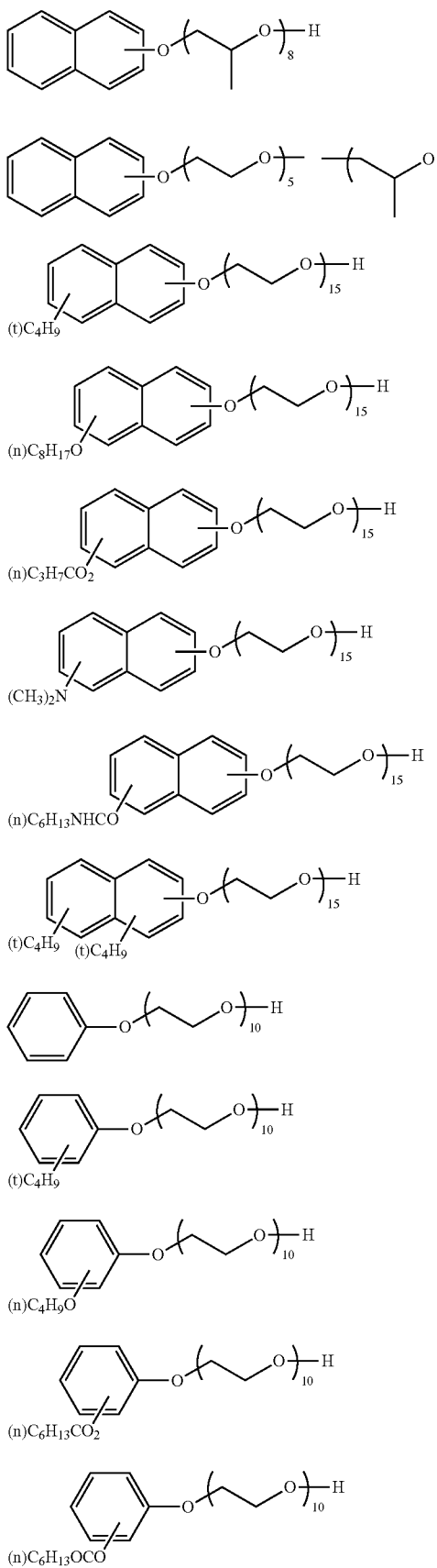
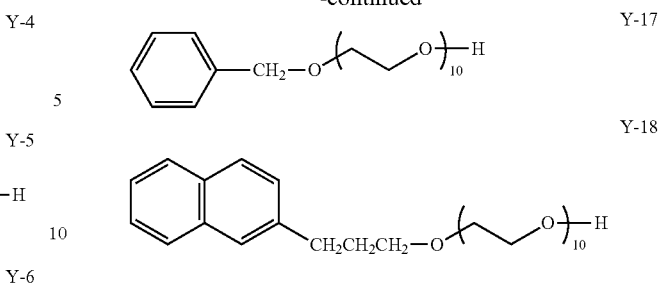

According to the invention, the amphoteric surfactant and nonionic surfactant having an alkylene oxide chain described above are used in combination. In particular, a developer which has pH from 2 to less than 10 and contains the amphoteric surfactant represented by formula (1) or (2) described above and the nonionic aromatic ether surfactant represented by formula (3) described above is preferred. A total amount of the amphoteric surfactant and nonionic surfactant having an alkylene oxide chain in the developer is preferably from 0.01 to 15% by weight, more preferably from 0.5 to 10% by weight, and particularly preferably from 1 to 9% by weight. Two or more kinds of the amphoteric surfactants and nonionic surfactants having an alkylene oxide chain may be used in combination, respectively.

A mixing ratio of the amphoteric surfactant and nonionic surfactant having an alkylene oxide chain is not particularly restricted and a weight ratio (weight ratio of a total amount of the amphoteric surfactant to a total amount of the nonionic surfactant having an alkylene oxide chain) is preferably from 5:95 to 95:5, more preferably from 10:90 to 90:10, and particularly preferably from 30:70 to 70:30.

In the amount described above, the effect of the invention, which not only the development property and solubility or dispersibility of the component of photosensitive layer are good but also the stain resistance and printing durability at the time of printing are good, is more remarkably exerted.

The developer may contain a nonionic surfactant other than the nonionic surfactant having an alkylene oxide chain, an anionic surfactant or a cationic surfactant, as far as the effect of the invention is not imparted.

As the nonionic surfactant, for example, glycerin fatty acid partial ester, a sorbitan fatty acid partial ester, a pentaerythritol fatty acid partial ester, a sucrose fatty acid partial ester, a polyglycerin fatty acid partial ester, a fatty acid diethanolamide, an N,N-bis-2-hydroxyalkylamine, a triethanolamine fatty acid ester, a trialkylamine oxide and a fluorine-based or silicon-based nonionic surfactant are exemplified.

The anionic surfactant is not particularly limited and a hitherto known anionic surfactant may be used. For example, a fatty acid salt, a abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkyldiphenylether (di)sulfonic acid salt, an alkylphenoxy polyoxyethylene alkylsulfonic acid salt, a polyoxyethylene alkylsulfophenyl ether salt, an N-alkyl-N-oleyltaurine sodium salt, an N-alkylsulfosuccinic acid monoamide disodium salt, a petroleum sulfonic acid salt, sulfated castor oil, sulfated beef tallow oil, a sulfate ester slat of fatty acid alkyl ester, an alkyl sulfate ester salt, a polyoxyethylene alkyl ether sulfate ester salt, a fatty acid monoglyceride sulfate ester salt, a polyoxyethylene alkyl phenyl ether sulfate ester salt, a polyoxyethylene styryl phenyl ether sulfate ester salt, an alkyl phosphate ester salt, a polyoxyethylene alkyl ether phosphate ester salt, a polyoxyethylene alkyl phenyl ether phosphate ester salt, a partially saponified product of styrene-maleic anhydride copolymer, a partially saponified products of olefin-maleic anhydride copolymer and a naphthalene sulfonate formalin condensate are exemplified.

The cationic surfactant is not particularly limited and a hitherto known cationic surfactant may be used. For example, an alkylamine salt, a quaternary ammonium salt, an alkylimidazolinium salt, a polyoxyethylene alkyl amine salt and a polyethylene polyamine derivative are exemplified.

Into the developer according to the invention it is also preferred to incorporate a water-soluble polymer compound having a film-forming property for the purpose of assisting oil-desensitization of the non-image area and plate surface protecting property.

As the water-soluble polymer compound, for example, gum arabic, a cellulose derivative (for example, carboxymethyl cellulose, carboxyethyl cellulose, methyl cellulose, hydroxypropyl cellulose or methylpropyl cellulose) or a modified product thereof, polyvinyl alcohol or a derivative thereof, polyvinyl pyrrolidone, polyacrylamide, a vinyl methyl ether/maleic anhydride copolymer, a vinyl acetate/maleic anhydride copolymer, a styrene/maleic anhydride copolymer, a starch derivative (for example, dextrin, maltodextrin, enzyme-decomposed dextrin, hydroxypropylated starch, hydroxypropylated starch enzyme-decomposed dextrin, carboxymethylated starch, phosphorylated starch or cyclodextrin), and pllulan or a derivative thereof are exemplified.

As other starch derivative which can be used as the water-soluble polymer compound, for instance, roast starch, for example, British gum, an enzymatically modified dextrin, for example, enzyme dextrin or Shardinger dextrin, oxidized starch, for example, solubilized starch, alphalized starch, for example, modified alphalized starch or unmodified alphalized starch, esterified starch, for example, starch phosphate, starch of fatty acid, starch sulfate, starch nitrate, starch xanthate or starch carbamate, etherified starch, for example, carboxyalkyl starch, hydroxyalkyl starch, sulfoalkyl starch, cyanoethyl starch, allyl starch, benzyl starch, carbamylethyl starch or dialkylamino starch, crosslinked starch, for example, methylol crosslinked starch, hydroxyalkyl crosslinked starch, phosphoric acid crosslinked starch or dicarboxylic acid crosslinked starch, and starch graft polymer, for example, starch-polyacrylamide copolymer, starch-polyacrylic acid copolymer, starch-polyvinyl acetate copolymer, starch-polyacrylonitrile copolymer, cationic starch-polyacrylate copolymer, cationic starch-vinyl polymer copolymer, starch-polystyrene-maleic acid copolymer, starch-polyethylene oxide copolymer or starch-polypropylene copolymer are exemplified.

A natural polymer compound which can be used as the water-soluble polymer compound includes, for example, a water-soluble soybean polysaccharide, a starch, for example, starch, gelatin, hemicellulose extracted from soybean, sweet potato starch, potato starch, tapioca starch, wheat starch or corn starch, a polymer obtained from seaweed, for example, carrageenan, laminaran, seaweed mannan, funori, Irish moss, agar or sodium alginate, plant mucilage, for example, of tororoaoi, mannan, quince seed, pectin, tragacanth gum, karaya gum, xanthine gum, guar bean gum, locust bean gum, carob gum or benzoin gum, bacteria mucilage, for example, of homopolysaccharide, e.g., dextran, glucan or levan or of heteropolysaccharide, e.g., succinoglucan or xanthan gum, and protein, for example, glue, gelatin, casein or collagen.

Among them, for instance, gum arabic, a starch derivative, for example, dextrin or hydroxypropyl starch, carboxymethyl cellulose or soybean polysaccharide can be preferably used.

The content of the water-soluble polymer compound in the developer is preferably from 0.05 to 15% by weight, and more preferably from 0.5 to 10% by weight.

Into the developer according to the invention it is also preferred to incorporate a pH buffer agent. As the pH buffer agent, a pH buffer agent exhibiting a buffer function at pH of 2 to 10 can be used without particular restriction. In the invention, a weak alkaline buffer agent is preferably used and includes, for example, (a) a carbonate ion and a hydrogen carbonate ion, (b) a borate ion, (c) a water-soluble amine compound and an ion of the amine compound, and a combination thereof. Specifically, for example, (a) a combination of carbonate ion-hydrogen carbonate ion, (b) a borate ion, or (c) a combination of water-soluble amine compound-ion of the amine compound is preferably used. The pH buffer agent exhibits a pH buffer function in the developer to prevent fluctuation of the pH even when the developer is used for a long period of time so that, for example, the deterioration of developing property resulting from the fluctuation of pH and the occurrence of development scum can be restrained. According to the invention, the combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferred. The alkali metals may be used individually or in combination of two or more thereof.

A total amount of the carbonate ion and hydrogen carbonate ion is preferably from 0.05 to 5 mole/l, more preferably from 0.07 to 2 mole/l, particularly preferably from 0.1 to 1 mole/l, in the developer.

According to the invention, a combination of a water-soluble amine compound and an ion of the amine compound is also preferably used.

The water-soluble amine compound is not particularly restricted and preferably a water-soluble amine having a group capable of facilitating water solubility. The group capable of facilitating water solubility includes, for example, a carboxylic acid group, a sulfonic acid group, a sulfinic acid group, a phosphonic acid group and a hydroxy group. The water-soluble amine compound may have two or more groups capable of facilitating water solubility. Further, the carboxylic acid group, sulfonic acid group, sulfinic acid group or phosphonic acid group may form a salt structure. Among them, an amine compound having a hydroxy group is particularly preferred.

Specific examples of the water-soluble amine compound having a carboxylic acid group, a sulfonic acid group or a sulfinic acid group include an amino acid, for example, glycine, aminodiacatic acid, lysine, threonine, serine, asparaginic acid, parahydroxyphenyl glycine, dihydroxyethyl glycine, alanine, anthranilic acid or tryptophan, sulfamic acid, cyclohexylsulfamic acid, a fatty acid amine sulfonic acid, for example, taurine, a fatty acid amine sulfinic acid, for example, aminoethanesulfinic acid, and a sodium salt, potassium salt or ammonium salt thereof. Among them, glycine or aminodiacetic acid is preferred.

Specific examples of the water-soluble amine compound having a phosphonic acid group (including a phosphinic acid group) include 2-aminoethylphosphonic acid, 1-aminoethane-1, 1-diphosphonic acid, 1-amino-1-phenylmethane-1, 1-diphosphonic acid, 1-dimethylaminoethane-1, 1-diphosphonic acid, ethylenediaminopentamethylenephosphonic acid, and a sodium salt, potassium salt or ammonium salt thereof. Among them, 2-aminoethylphosphonic acid or a salt thereof is preferred.

Specific examples of the water-soluble amine compound having a hydroxy group include monoethanol amine, diethanol amine, triethanol amine, N-hydroxyethylmorpholine, monopropanol amine, monoisopropanol amine, dipropanol amine, diisoprppanol amine, tripropanol amine, triisopropanol amine and N,N-diethanolaniline Among them, monoethanol amine, diethanol amine, triethanol amine or N-hydroxyethylmorpholine is preferred.

The ion of the water-soluble amine compound may be generated in an aqueous solution of the water-soluble amine compound. To the aqueous solution of the water-soluble amine compound may further be added an alkali or an acid. Alternatively, the ion of the water-soluble amine compound may be contained in an aqueous solution by adding a salt of the water-soluble amine compound.

As the alkali, for example, sodium hydroxide, potassium hydroxide, lithium hydroxide, sodium carbonate, potassium carbonate, ammonium carbonate, sodium hydrogen carbonate, potassium hydrogen carbonate, ammonium hydrogen carbonate, or a combination thereof is used. As the acid, for example, an inorganic acid, for example, hydrochloric acid, sulfuric acid, a nitric acid or phosphoric acid is used, and particularly hydrochloric acid or phosphoric acid is preferred. By adding such an alkali or acid, the pH can be finely adjusted.

A total amount of the water-soluble amine compound and ion of the amine compound is preferably from 0.05 to 5 mole/l, more preferably from 0.07 to 2 mole/l, particularly preferably from 0.1 to 1 mole/l, in the developer.

The developer according to the invention may contain an organic solvent. As the organic solvent capable of being contained, for example, an aliphatic hydrocarbon (e.g., hexane, heptane, Isopar E, Isopar H, Isopar G (produced by Esso Chemical Co., Ltd.)), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone).

The organic solvent contained in the developer may be used two or more kinds in combination. When the organic solvent is insoluble in water, it may be employed by being solubilized in water using a surfactant or the like. The concentration of the organic solvent is desirably less than 40% by weight, preferably less than 10% by weight, more preferably less than 5% by weight, in view of safety and inflammability.

The developer may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer according to the invention can be used as a developer for the exposed lithographic printing plate precursor and a development replenisher, if desired. The developer can be preferably applied to the automatic development processor described above. In the case of conducting the development processing using the automatic development processor, the developer becomes fatigued in accordance with the processing amount, and hence the processing ability may be restored using a replenisher or a fresh developer.

In the method of preparing a lithographic printing plate according to the invention, the lithographic printing plate precursor may be heated its entire surface before the exposure, during the exposure or between the exposure and the development, if desired. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise in that the unexposed area is cured. On the other hand, the heating after the development can be performed using very strong conditions and is ordinarily carried out in a temperature range from 100 to 500° C. When the temperature is too low, a sufficient effect of strengthening the image may not be obtained, whereas when it is excessively high, problems of deterioration of the support and thermal decomposition of the image area may occur.

EXAMPLES

The present invention will be described in more detail with reference to the following examples, but the invention should not be construed as being limited thereto.

Examples 1 to 29 and Comparative Examples 1 to 8

(1) Preparation of Lithographic Printing Plate Precursor

<Preparation of Support 1>

An aluminum plate (material: 1050, refining: H16) having a thickness of 0.24 mm was immersed in an aqueous 5% by weight sodium hydroxide solution maintained at 65° C. to conduct a degreasing treatment for one minute, followed by washed with water. The aluminum plate was immersed in an aqueous 10% by weight hydrochloric acid solution maintained at 25° C. for one minute to neutralize, followed by washed with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% by weight sodium hydroxide solution maintained at 60° C. for 10 seconds. The aluminum plate was subjected to an anodizing treatment under condition of current density of 10 A/dm$^2$ and voltage of 15 V in an aqueous 15% by weight sulfuric acid solution at 25° C. for one minute and then subjected to a hydrophilization treatment by immersing in an aqueous 1% by weight polyvinylphosphonic acid solution at 60° C. for 10 seconds, washing at 20° C. with hard water having calcium ion concentration of 75 ppm for 4 seconds and then with pure water for 4 seconds and drying, thereby preparing Support 1. The adsorption amount of calcium was 2.0 mg/m$^2$. The surface roughness of the support was measured and found to be 0.44 μm (Ra indication according to JIS B 0601).

<Preparation of Support 2>

An aluminum plate (material: 1050, refining: H16) having a thickness of 0.3 mm was immersed in an aqueous 10% by weight sodium hydroxide solution at 60° C. for 25 seconds to effect etching, washed with miming water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm$^2$. Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfuric acid solution for 2 minutes under condition of current density of 2 A/dm$^2$ to form an anodic oxide film having a thickness of 2.7 g/m$^2$. Then, the aluminum plate was subjected to a hydrophilization treatment by immersing in an aqueous 1% polyvinylphosphonic acid solution at 60° C. for 10 seconds, washing at 20° C. with hard water having calcium ion concentration of 75 ppm for 4 seconds and then with pure water for 4 seconds and drying, thereby preparing Support 2. The surface roughness of the support was measured and found to be 0.28 μm (Ra indication according to JIS B 0601).

<Preparation of Support 3>

An aluminum plate (material: 1050, refining: H16) having a thickness of 0.3 mm was immersed in an aqueous 10% by weight sodium hydroxide solution at 60° C. for 25 seconds to effect etching, washed with running water, neutralized and cleaned with an aqueous 20% by weight nitric acid solution and then washed with water. The aluminum plate was subjected to an electrolytic surface roughening treatment in an aqueous 1% by weight nitric acid solution using an alternating current with a sinusoidal waveform at an anode time electricity of 300 coulomb/dm$^2$. Subsequently, the aluminum plate was immersed in an aqueous 1% by weight sodium hydroxide solution at 40° C. for 5 seconds, immersed in an aqueous 30% by weight sulfuric acid solution at 60° C. for 40 seconds to effect a desmut treatment, and then subjected to an anodizing treatment in an aqueous 20% by weight sulfuric acid solution for 2 minutes under condition of current density of 2 A/dm$^2$ to form an anodic oxide film having a thickness of 2.7 g/m$^2$. The surface roughness of the aluminum plate thus-treated was measured and found to be 0.28 μm (Ra indication according to JIS B 0601).

Coating solution (1) for undercoat layer shown below was coated on the aluminum plate described above using a bar coater and dried at 80° C. for 20 seconds to prepare Support 3. The coating amount of the undercoat layer after drying was 12 mg/m$^2$.

| <Coating solution (1) for undercoat layer> | |
|---|---|
| Undercoat Compound (1) (weight average molecular weight: 50,000) shown below | 0.017 g |
| Methanol | 9.00 g |
| Water | 1.00 g |

Undercoat Compound (1)

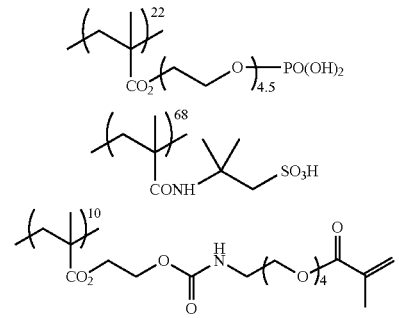

<Preparation of Support 4>

An aluminum plate (material: 1050, refuting: H16) having a thickness of 0.3 mm was subjected to a degrease treatment with an aqueous 10% by weight sodium aluminate solution at 50° C. for 30 seconds in order to remove rolling oil on the surface thereof. Thereafter, the aluminum plate surface was grained using three nylon brushes implanted with bundled bristles having a diameter of 0.3 mm and an aqueous suspension (having specific gravity of 1.1 g/cm³) of pumice having a median diameter of 25 μm, and then thoroughly washed with water. The aluminum plate was etched by immersing it in an aqueous 25% by weight sodium hydroxide solution at 45° C. for 9 seconds and after washing with water, immersed in an aqueous 20% by weight nitric acid solution at 60° C. for 20 seconds, followed by washing with water. The etching amount of the grained surface was about 3 g/m².

Subsequently, the aluminum plate was subjected to a continuous electrochemical surface-roughening treatment using alternate current voltage of 60 Hz. The electrolytic solution used was an aqueous 1% by weight nitric acid solution (containing 0.5% by weight of aluminum ion) at a liquid temperature of 50° C. The electrochemical surface-roughening treatment was performed using a rectangular wave alternate current having a trapezoidal waveform such that the time TP necessary for the current value to reach the peak from zero was 0.8 msec and the duty ratio was 1:1, and disposing a carbon electrode as the counter electrode. The auxiliary anode used was ferrite. The current density was 30 A/dm² in terms of the peak value of current, and 5% of the current flowing from the power source was divided to the auxiliary anode. The quantity of electricity at the nitric acid electrolysis was 175 C/dm² when the aluminum plate was serving as the anode. Then, the aluminum plate was washed with water by spraying.

Then, the aluminum plate was subjected to an electrochemical surface-roughening treatment in the same manner as in the nitric acid electrolysis described above using, as the electrolytic solution, an aqueous 0.5% by weight hydrochloric acid solution (containing 0.5% by weight of aluminum ion) at a liquid temperature of 50° C. under the condition that the quantity of electricity was 50 C/dm² when the aluminum plate was serving as the anode, and then washed with water by spraying. The aluminum plate was then treated in an aqueous 15% by weight sulfuric acid solution (containing 0.5% by weight of aluminum ion) as the electrolytic solution at a current density of 15 A/dm² to provide a direct current anodic oxide film of 2.5 g/m², thereafter washed with water and dried. Then, the aluminum plate was treated with an aqueous 1% by weight sodium silicate solution at 20° C. for 10 seconds. The surface roughness of the aluminum plate thus-treated was measured and found to be 0.54 μm (Ra indication according to JIS B 0601).

Coating solution (2) for undercoat layer shown below was coated on the aluminum plate described above using a bar coater and dried at 80° C. for 20 seconds to prepare Support 4. The coating amount of the undercoat layer after drying was 18 mg/m².

| <Coating solution (2) for undercoat layer> | |
|---|---|
| Undercoat Compound (2) (weight average molecular weight: 20,000) shown below | 0.026 g |
| Methanol | 5.00 g |
| Water | 5.00 g |

Undercoat Compound (2)

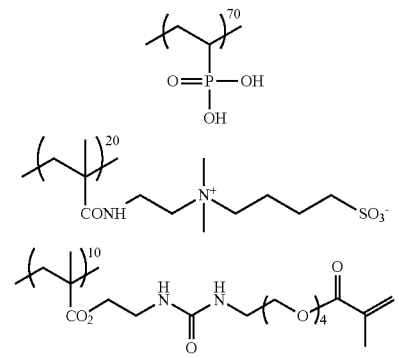

<Formation of Photosensitive Layer 1>

Coating solution (1) for photosensitive layer having the composition shown below was coated on a support using a bar and dried in an oven at 90° C. for 60 seconds to form Photosensitive layer 1 having a dry coating amount of 1.3 g/m².

| <Coating solution (1) for photosensitive layer> | |
|---|---|
| Binder Polymer (1) (weight average molecular weight: 50,000) shown below | 0.34 g |
| Polymerizable Compound (1) shown below (PLEX 6661-O, produced by Degussa Japan Co., Ltd.) | 0.68 g |
| Sensitizing Dye (1) shown below | 0.06 g |
| Polymerization Initiator (1) shown below | 0.18 g |
| Chain Transfer Agent (1) shown below | 0.02 g |
| Dispersion of ∈-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-Nitrosophenylhydroxylamine aluminum salt | 0.01 g |
| Fluorine-Based Surfactant (1) (weight average molecular weight: 10,000) shown below | 0.001 g |
| Polyoxyethylene-polyoxypropylene condensate (PLURONIC L44, produced by ADEKA Corp.) | 0.02 g |
| Dispersion of yellow pigment (yellow pigment (NOVOPERM YELLOW H2G, produced by Clariant Corp.): 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.04 g |

| <Coating solution (1) for photosensitive layer> | |
|---|---|
| 1-Methoxy-2-propanol | 3.5 g |
| Methyl ethyl ketone | 8.0 g |
Binder Polymer (1)
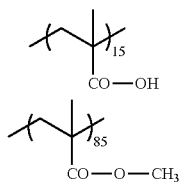
(Acid value: 85 mg-KOH/g)
Polymerizable Compound (1)
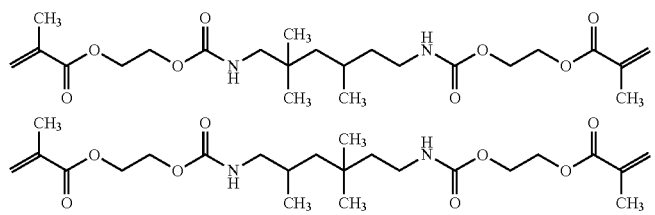
(Mixture of the isomers described above)
Sensitizing Dye (1)
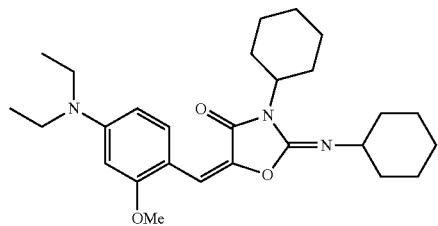 [SMILES: CCN(CC)c1ccc(/C=C2/OC(=NC3CCCCC3)N(C3CCCCC3)C2=O)c(OC)c1]
Polymerization Initiator (1)
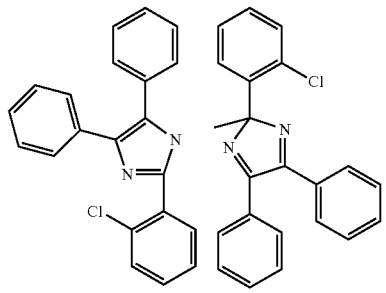
Chain Transfer Agent (1)
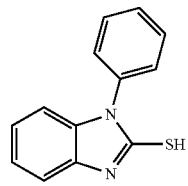 [SMILES: Sc1nc2ccccc2n1-c1ccccc1]

| <Coating solution (1) for photosensitive layer> | |
|---|---|

Fluorine-Based Surfactant (1)

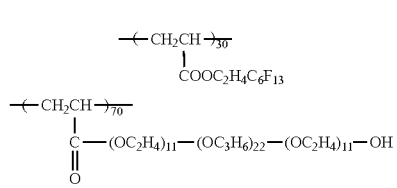

<Formation of Photosensitive Layer 2>

Coating solution (2) for photosensitive layer having the composition shown below was coated on a support using a bar and dried in an oven at 125° C. for 34 seconds to form Photosensitive layer 2 having a dry coating amount of 1.4 g/m².

| <Coating solution (2) for photosensitive layer> | |
|---|---|
| Infrared Absorbing Agent (IR-1) shown below | 0.038 g |
| Polymerization Initiator (S-1) shown below | 0.061 g |
| Polymerization Initiator (I-1) shown below | 0.094 g |
| Chain Transfer Agent (1) shown above | 0.015 g |
| Ethylenically Unsaturated Compound (M-1) shown below (A-BPE-4, produced by Shin-Nakamura Chemical Co., Ltd.) | 0.425 g |
| Binder Polymer (B-1) (weight average molecular weight: 110,000) shown below | 0.311 g |
| Binder Polymer (B-2) (weight average molecular weight: 100,000) shown below | 0.250 g |

| <Coating solution (2) for photosensitive layer> | |
|---|---|
| Binder Polymer (B-3) (weight average molecular weight: 120,000) shown below | 0.062 g |
| Polyoxyethylene-polyoxypropylene condensate (PLURONIC L44, produced by ADEKA Corp.) | 0.010 g |
| Additive (T-1) shown below | 0.079 g |
| Polymerization Inhibitor (Q-1) shown below | 0.0012 g |
| Ethyl Violet (EV-1) shown below | 0.021 g |
| Fluorine-Based Surfactant (1) (weight average molecular weight: 10,000) shown above | 0.0081 g |
| Methyl ethyl ketone | 5.886 g |
| Methanol | 2.733 g |
| 1-Methoxy-2-propanol | 5.886 g |

In the formulae shown below, Me indicates a methyl group. The ratio of each monomer unit in Binder Polymers A to C shown below is indicated as a molar ratio.

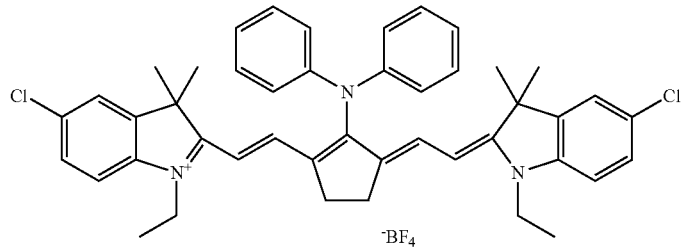

(IR-1)

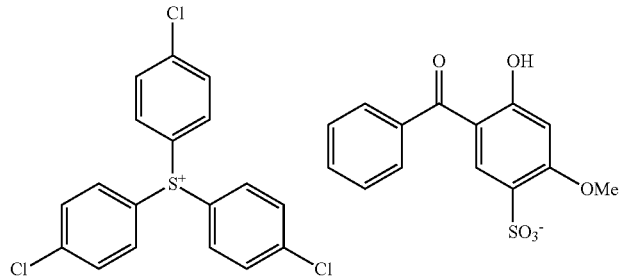

(S-1)

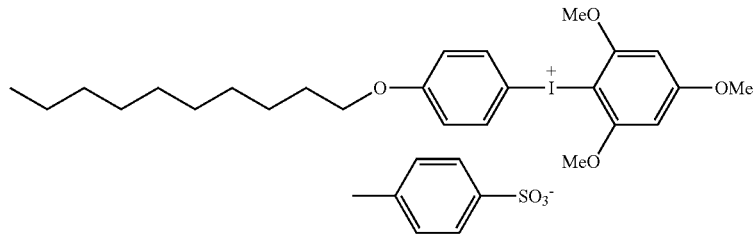

(I-1)

-continued
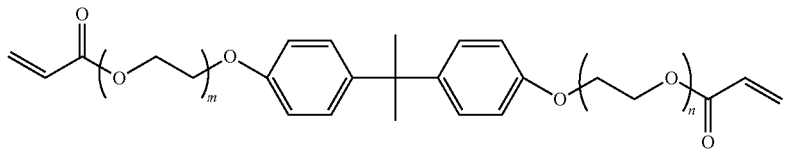
(M-1)
m + n = 4
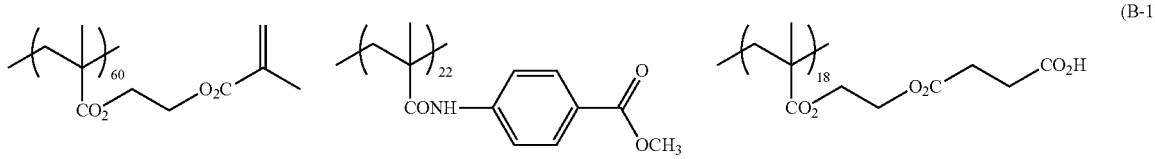
(B-1)
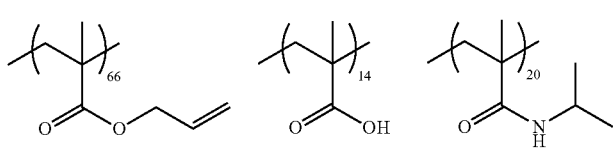
(B-2)
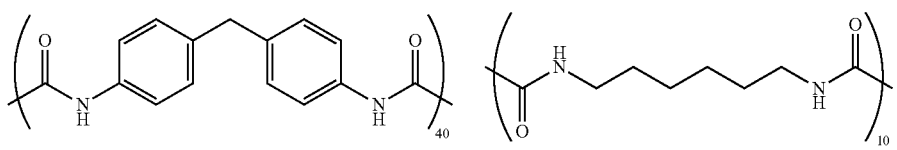
(B-3)
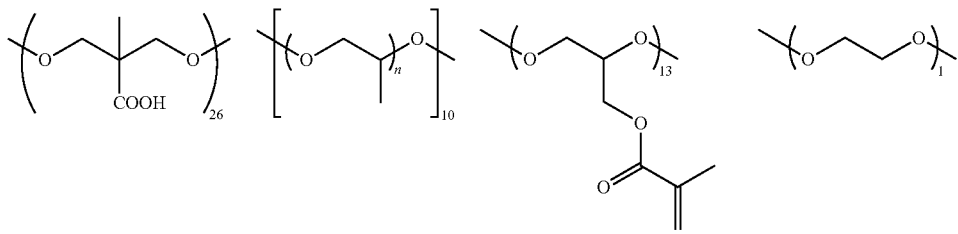
Mw: 1,000
(Average value of n: 17)
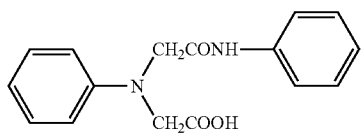
(T-1)
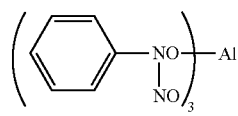
(Q-1)
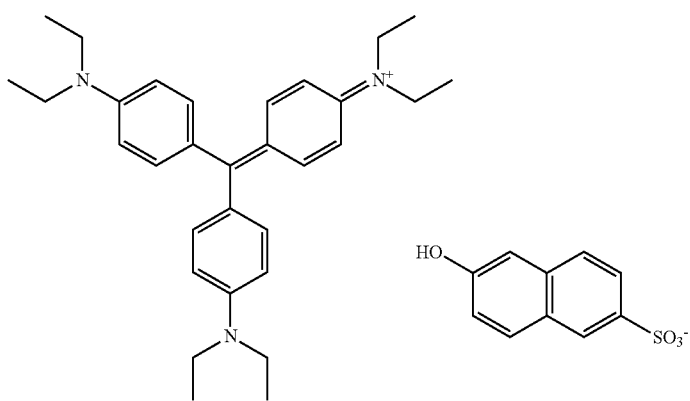
(EV-1)

<Formation of Photosensitive Layer 3>

Coating solution (3) for photosensitive layer having the composition shown below was coated on a support using a bar and dried in an oven at 90° C. for 60 seconds to form Photosensitive layer 3 having a dry coating amount of 1.3 g/m².

| <Coating solution (3) for photosensitive layer> | |
|---|---|
| Binder Polymer (1) (weight average molecular weight: 50,000) shown above | 0.04 g |
| Binder Polymer (2) (weight average molecular weight: 80,000) shown below | 0.30 g |
| Polymerizable Compound (1) shown above (PLEX 6661-O, produced by Degussa Japan Co., Ltd.) | 0.17 g |
| Polymerizable Compound (2) shown below | 0.51 g |
| Sensitizing Dye (2) shown below | 0.03 g |
| Sensitizing Dye (3) shown below | 0.015 g |
| Sensitizing Dye (4) shown below | 0.015 g |
| Polymerization Initiator (1) shown above | 0.13 g |
| Chain Transfer Agent Mercaptobenzothiazole | 0.01 g |
| Dispersion of ∈-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-Nitrosophenylhydroxylamine aluminum salt | 0.01 g |
| Fluorine-Based Surfactant (1) (weight average molecular weight: 10,000) shown above | 0.001 g |
| 1-Methoxy-2-propanol | 3.5 g |
| Methyl ethyl ketone | 8.0 g |

Binder Polymer (2)

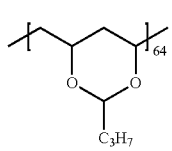 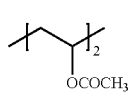 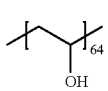

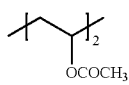

Polymerizable Compound (2)

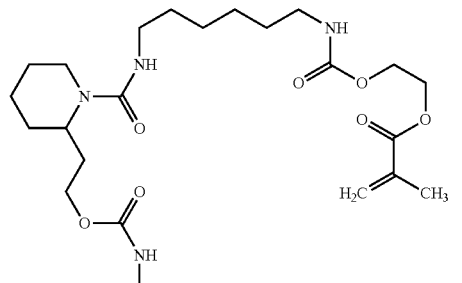

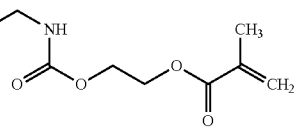

Sensitizing Dye (2)

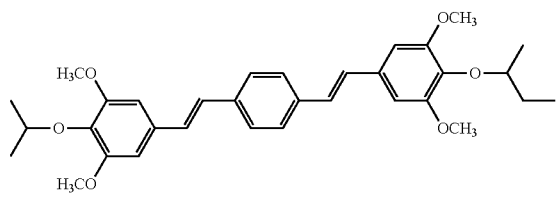 [SMILES: CCC(C)Oc1c(OC)cc(/C=C/c2ccc(/C=C/c3cc(OC)c(OC(C)C)c(OC)c3)cc2)cc1OC]

<Coating solution (3) for photosensitive layer>

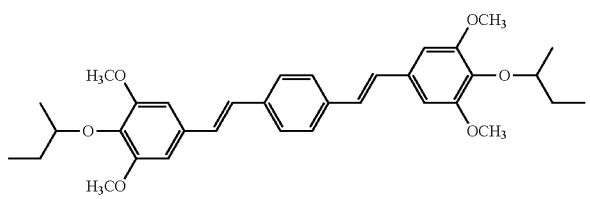 [SMILES: CCC(C)Oc1c(OC)cc(/C=C/c2ccc(/C=C/c3cc(OC)c(OC(C)CC)c(OC)c3)cc2)cc1OC]

Sensitizing Dye (3)

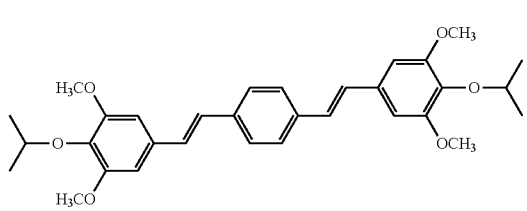 [SMILES: COc1cc(/C=C/c2ccc(/C=C/c3cc(OC)c(OC(C)C)c(OC)c3)cc2)cc(OC)c1OC(C)C]

Sensitizing Dye (4)

<Formation of Photosensitive Layer 4>

Coating solution (4) for photosensitive layer having the composition shown below was coated on a support using a bar and dried in an oven at 90° C. for 60 seconds to form Photosensitive layer 4 having a dry coating amount of 1.3 g/m$^2$.

| <Coating solution (4) for photosensitive layer> | |
|---|---|
| Binder Polymer (B-3) shown above | 0.34 g |
| Polymerizable Compound (1) shown above (PLEX 6661-O, produced by Degussa Japan Co., Ltd.) | 0.68 g |
| Sensitizing Dye (1) shown above | 0.06 g |
| Polymerization Initiator (1) shown above | 0.18 g |
| Chain Transfer Agent (1) shown above | 0.02 g |
| Dispersion of ε-phthalocyanine pigment (pigment: 15 parts by weight; dispersing agent (allyl methacrylate/methacrylic acid copolymer (weight average molecular weight: 60,000, copolymerization molar ratio: 83/17)): 10 parts by weight; cyclohexanone: 15 parts by weight) | 0.40 g |
| Thermal polymerization inhibitor N-Nitrosophenylhydroxylamine aluminum salt | 0.01 g |
| Fluorine-Based Surfactant (1) (weight average molecular weight: 10,000) shown above | 0.001 g |
| 1-Methoxy-2-propanol | 3.5 g |
| Methyl ethyl ketone | 8.0 g |

<Formation of Photosensitive Layer 5>

Coating solution (5) for photosensitive layer was prepared by changing the amount of Binder Polymer (B-3) to 0.408 g and the amount of Polymerizable Compound (1) to 0.612 g in Coating solution (4) for photosensitive layer and coated on a support using a bar and dried in an oven at 90° C. for 60 seconds to form Photosensitive layer 5 having a dry coating amount of 1.3 g/m$^2$.

<Formation of Photosensitive Layer 6>

Coating solution (6) for photosensitive layer was prepared by changing the amount of Binder Polymer (B-3) to 0.291 g and the amount of Polymerizable Compound (1) to 0.729 g in Coating solution (4) for photosensitive layer and coated on a support using a bar and dried in an oven at 90° C. for 60 seconds to form Photosensitive layer 6 having a dry coating amount of 1.3 g/m$^2$.

<Formation of Protective Layer 1>

Coating solution (1) for protective layer having the composition shown below was coated on a photosensitive layer using a bar so as to have a dry coating amount of 1.5 g/m$^2$ and dried at 125° C. for 70 seconds to form Protective layer 1.

| <Coating solution (1) for protective layer> | |
|---|---|
| Dispersion of mica (1) shown below | 0.6 g |
| Sulfonic acid-modified polyvinyl alcohol (GOSERAN CKS-50, produced by Nippon Synthetic Chemical Industry Co., Ltd. (saponification degree: 99% by mole; average polymerization degree: 300; modification degree: about 0.4% by mole)) | 0.8 g |
| Vinyl pyrrolidone/vinyl acetate (1/1) copolymer (weight average molecular weight: 70,000) | 0.001 g |
| Surfactant (EMALEX 710, produced by Nihon Emulsion Co., Ltd.) | 0.002 g |
| Water | 13 g |

(Preparation of Dispersion of Mica (1))

In 368 g of water was added 32 g of synthetic mica (SOMASIF ME-100, produced by CO—OP Chemical Co., Ltd., aspect ratio: 1,000 or more) and the mixture was dispersed using a homogenizer until the average particle diameter (measured by a laser scattering method) became 0.5 μm to obtain Dispersion of mica (1).

<Formation of Protective Layer 2>

Coating solution (2) for protective layer having the composition shown below was coated on a photosensitive layer using a bar so as to have a dry coating amount of 1.2 g/m$^2$ and dried at 125° C. for 70 seconds to form Protective layer 2.

| <Coating solution (2) for protective layer> | |
|---|---|
| PVA-205 (partially hydrolyzed polyvinyl alcohol, produced by Kuraray Co., Ltd. (saponification degree: 86.5 to 89.5% by mole, viscosity: 4.6 to 5.4 mPa · s in a 4% by weight aqueous solution at 20° C.)) | 0.658 g |
| PVA-105 (fully hydrolyzed polyvinyl alcohol, produced by Kuraray Co., Ltd. (saponification degree: 98.0 to 99.0% by mole, viscosity: 5.2 to 6.0 mPa · s in a 4% by weight aqueous solution at 20° C.)) | 0.142 g |
| Vinyl pyrrolidone/vinyl acetate (1/1) copolymer (weight average molecular weight: 70,000) | 0.001 g |

-continued

| <Coating solution (2) for protective layer> | |
|---|---|
| Surfactant (EMALEX 710, produced by Nihon Emulsion Co., Ltd.) | 0.002 g |
| Water | 13 g |

The supports, photosensitive layers and protective layers described above were combined as shown in Table 2 to prepare lithographic printing plate precursors, respectively.

(2) Exposure, Development Processing and Printing

The lithographic printing plate precursor was subjected to image exposure by a violet semiconductor laser plate setter Vx9600 (having InGaN semiconductor laser (emission wavelength: 405 nm±10 nm/output: 30 mW)) produced by FUJI-FILM Electronic Imaging Ltd. The image exposure was performed at resolution of 2,438 dpi with halftone dots of 50% using FM screen (TAFFETA 20, produced by FUJIFILM Corp.) in a plate surface exposure amount of 0.05 mJ/cm$^2$.

The exposed lithographic printing plate precursor was then subjected to development processing using Developers 1 to 16 having the composition (the content of each component being indicated as a unit of g) and pH shown in Table 1 as shown in Table 2 in an automatic development processor having the structure shown in FIG. 1 wherein a heater was set so as to reach the plate surface temperature at 100° C. in the pre-heating unit and the development processing was conducted at a transporting speed so as to make the immersion time (developing time) in the developer for 20 seconds, thereby preparing a lithographic printing plate.

Then, the lithographic printing plate obtained was mounted on LITHRONE printing machine (produced by Komori Corp.) and printing was performed at a printing speed of 6,000 sheets per hour using VALUES-G (N) Black Ink (produced by Dainippon Ink & Chemicals, Inc.) as ink and a solution prepared by diluting IF-102 (produced by FUJIFILM Corp.) with water to 4% by volume concentration as dampening water.

(3) Evaluation

Using each of the lithographic printing plate precursors, the development property, processing property, printing staining property and printing durability were evaluated in the manner shown below.

<Development Property>

The lithographic printing plate precursor was subjected to the exposure and development processing as described above and residue of the photosensitive layer in the non-image area of the lithographic printing plate obtained was visually observed to conduct evaluation of the development property. The evaluation was conducted according to the criteria described below.

O: Residue of the photosensitive layer was not observed to exhibit good development property.

OΔ: An extremely slight residue of the photosensitive layer was observed, but developing property was no problem.

Δ: A slight residue of the photosensitive layer was observed, but developing property was no problem.

X: The photosensitive layer remained to cause poor development.

<Processing Property>

After the lithographic printing plate precursor was subjected to development processing by the automatic development processor as described above in an amount of 1,000 m$^2$, state of scum (oily or solid scum floating on the surface of the developer or adhering to a tank wall or a member, for example, a roller) occurred in a tank of the automatic development processor was observed. The evaluation was conducted according to the criteria described below.

O: Case where the occurrence of scum was not observed.

OΔ: Case where the occurrence of scum was slightly observed, but the scum did not adhere on the surface of the lithographic printing plate subjected to the development processing.

Δ: Case where the occurrence of scum was observed, but the scum scarcely adhered on the surface of the lithographic printing plate subjected to the development processing.

X: Case where the occurrence of scum was severe and the scum adhered on the surface of the lithographic printing plate subjected to the development processing.

<Printing Staining Property>

Using a lithographic printing plate prepared as described above using the developer after the development processing of 1,000 m$^2$ of the lithographic printing plate precursor, the printing was performed as described above and a staining property of the non-image area on 1,000th printed material was evaluated. The evaluation was conducted according to the criteria described below.

O: Case where ink stain in the non-image area was not observed.

X: Case where ink stain in the non-image area was observed.

<Printing Durability>

As increase in the number of printed materials, the image of the photosensitive layer formed on the lithographic printing plate was gradually abraded to cause decrease in the ink receptive property, resulting in decrease of ink density of the image on the printing paper. A number of printed materials obtained until the ink density (reflection density) decreased by 0.1 from that at the initiation of printing was determined to evaluate the printing durability.

TABLE 1

| Component | Developer | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Surfactant | | | | | | | | | | | | |
| I-k (N-Laurylamidopropyl dimethyl betaine) | 500 | 500 | 400 | 250 | 75 | | 200 | | 400 | 400 | | |
| II-f (N-Laurylamidopropyl dimethylamine oxide) | | | | | | 400 | 200 | | | | | |
| I-a (N-Lauryl dimethyl betaine) | | | | | | | | 400 | | | | 400 |
| I-i (N-Lauryl methyl betaine) | | | | | | | | | | | 400 | |
| Y-1 (Polyoxyethylene naphthyl ether) | 75 | 250 | 400 | 500 | 500 | | 400 | | 400 | 400 | 400 | |
| Y-12 (Polyoxyethylene phenyl ether) | | | | | | 400 | | | | | | |

TABLE 1-continued

| Component | | | | | | | | | | | | |
|---|---|---|---|---|---|---|---|---|---|---|---|---|
| Y-13 (Polyoxyethylene tert-butylphenyl ether) | | | | | | | | | 400 | | | 400 |
| Alkyldiphenyl ether disulfonate (ELEMINOL MON2, produced by Sanyo Chemical Industries, Ltd.) | | | | | | | | | | | | |
| pH Buffer Agent | | | | | | | | | | | | |
| Sodium carbonate | 88 | 88 | 88 | 88 | 88 | 88 | 88 | 88 | | 88 | 88 | |
| Sodium hydrogen carbonate | 37 | 37 | 37 | 37 | 37 | 37 | 37 | 37 | | 37 | 37 | |
| N-Hydroxyethyl morpholine | | | | | | | | | 100 | | | 100 |
| Triethanolamine | | | | | | | | | 200 | | | 200 |
| Phosphoric acid | To adjust pH shown below | To adjust pH shown below | To adjust pH shown below | To adjust pH shown below | To adjust pH shown below | To adjust pH shown below | To adjust pH shown below | To adjust pH shown below | To adjust pH shown below | To adjust pH shown below | To adjust pH shown below | To adjust pH shown below |
| Others | | | | | | | | | | | | |
| Water-soluble Polymer Compound (1) shown below | 150 | 150 | 150 | 150 | 150 | 150 | 150 | 150 | 150 | | 150 | |
| Sodium gluconate | 50 | 50 | 50 | 50 | 50 | 50 | 50 | 50 | 50 | 50 | 50 | 50 |
| Ammonium primary phosphate | 20 | 20 | 20 | 20 | 20 | 20 | 20 | 20 | 20 | 20 | 20 | 20 |
| 2-Bromo-2-nitropropane-1,3-diol | 0.1 | 0.1 | 0.1 | 0.1 | 0.1 | 0.1 | 0.1 | 0.1 | 0.1 | 0.1 | 0.1 | 0.1 |
| 2-Methyl-4-isothiazolin-3-one | 0.1 | 0.1 | 0.1 | 0.1 | 0.1 | 0.1 | 0.1 | 0.1 | 0.1 | 0.1 | 0.1 | 0.1 |
| Ethylenediamine disuccinic acid | 20 | 20 | 20 | 20 | 20 | 20 | 20 | 20 | 20 | 20 | 20 | 20 |
| Defoaming agent (TSA 739, produced by GE Toshiba Silicones Co., Ltd.) | 2 | 2 | 2 | 2 | 2 | 2 | 2 | 2 | 2 | 2 | 2 | 2 |
| Water | 8557.8 | 8382.8 | 8332.8 | 8382.8 | 8557.8 | 8332.8 | 8332.8 | 8332.8 | 8457.8 | 8482.8 | 8332.8 | 8607.8 |
| pH of Developer | 9.8 | 9.8 | 9.8 | 9.8 | 9.8 | 9.8 | 9.8 | 9.8 | 6.9 | 9.8 | 9.8 | 7.0 |

| | Developer | | | |
|---|---|---|---|---|
| Component | 13 (for Comparison) | 14 (for Comparison) | 15 (for Comparison) | 16 (for Comparison) |
| Surfactant | | | | |
| I-k (N-Laurylamidopropyl dimethyl betaine) | 800 | | 400 | |
| II-f (N-Laurylamidopropyl dimethylamine oxide) | | | | |
| I-a (N-Lauryl dimethyl betaine) | | | | |
| I-i (N-Lauryl methyl betaine) | | | | |
| Y-1 (Polyoxyethylene naphthyl ether) | | 800 | | 400 |
| Y-12 (Polyoxyethylene phenyl ether) | | | | |
| Y-13 (Polyoxyethylene tert-butylphenyl ether) | | | | |
| Alkyldiphenyl ether disulfonate (ELEMINOL MON2, produced by Sanyo Chemical Industries, Ltd.) | | | 400 | 400 |
| pH Buffer Agent | | | | |
| Sodium carbonate | 88 | 88 | 88 | 88 |
| Sodium hydrogen carbonate | 37 | 37 | 37 | 37 |
| N-Hydroxyethyl morpholine | | | | |
| Triethanolamine | | | | |
| Phosphoric acid | To adjust pH shown below | To adjust pH shown below | To adjust pH shown below | To adjust pH shown below |
| Others | | | | |
| Water-soluble Polymer Compound (1) shown below | 150 | 150 | 150 | 150 |
| Sodium gluconate | 50 | 50 | 50 | 50 |
| Ammonium primary phosphate | 20 | 20 | 20 | 20 |
| 2-Bromo-2-nitropropane-1,3-diol | 0.1 | 0.1 | 0.1 | 0.1 |
| 2-Methyl-4-isothiazolin-3-one | 0.1 | 0.1 | 0.1 | 0.1 |
| Ethylenediamine disuccinic acid | 20 | 20 | 20 | 20 |
| Defoaming agent (TSA 739, produced by GE Toshiba Silicones Co., Ltd.) | 2 | 2 | 2 | 2 |

TABLE 1-continued

| | | | | |
|---|---|---|---|---|
| Water | 8332.8 | 8332.8 | 8332.8 | 8332.8 |
| pH of Developer | 9.8 | 9.8 | 9.8 | 9.8 |

Water-soluble Polymer Compound (1)

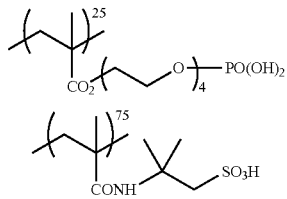

(weight average molecular weight: 80,000)

TABLE 2

| | Support | Photosensitive Layer | Protective Layer | Developer | Development Property | Processing Property | Printing Staining Property | Printing Durability (number of sheets) |
|---|---|---|---|---|---|---|---|---|
| Example 1 | 1 | 1 | 1 | 3 | ○ | ○ | ○ | 200,000 |
| Example 2 | 2 | 1 | 1 | 3 | ○ | ○ | ○ | 200,000 |
| Example 3 | 3 | 1 | 1 | 3 | ○ | ○ | ○ | 250,000 |
| Example 4 | 4 | 1 | 1 | 3 | ○ | ○ | ○ | 230,000 |
| Example 5 | 4 | 3 | 2 | 3 | ○ | ○ | ○ | 180,000 |
| Example 6 | 4 | 3 | 2 | 9 | ○ | ○ | ○ | 180,000 |
| Example 7 | 4 | 3 | 1 | 3 | ○ | ○ | ○ | 200,000 |
| Example 8 | 4 | 4 | 1 | 3 | ○ | ○ | ○ | 280,000 |
| Example 9 | 4 | 4 | 2 | 3 | ○ | ○ | ○ | 250,000 |
| Example 10 | 4 | 5 | 1 | 3 | ○ | ○ | ○ | 250,000 |
| Example 11 | 4 | 6 | 1 | 3 | ○ | ○ | ○ | 300,000 |
| Example 12 | 4 | 4 | 1 | 1 | ○Δ | ○ | ○ | 280,000 |
| Example 13 | 4 | 4 | 1 | 2 | ○ | ○ | ○ | 280,000 |
| Example 14 | 4 | 4 | 1 | 4 | ○ | ○ | ○ | 250,000 |
| Example 15 | 4 | 4 | 1 | 5 | ○ | ○Δ | ○ | 250,000 |
| Example 16 | 4 | 6 | 1 | 1 | ○Δ | ○ | ○ | 300,000 |
| Example 17 | 4 | 6 | 1 | 2 | ○ | ○ | ○ | 300,000 |
| Example 18 | 4 | 6 | 1 | 4 | ○ | ○Δ | ○ | 280,000 |
| Example 19 | 4 | 6 | 1 | 5 | ○ | ○Δ | ○ | 280,000 |
| Example 20 | 4 | 5 | 1 | 1 | ○Δ | ○ | ○ | 250,000 |
| Example 21 | 4 | 5 | 1 | 2 | ○Δ | ○ | ○ | 250,000 |
| Example 22 | 4 | 5 | 1 | 4 | ○ | ○ | ○ | 230,000 |
| Example 23 | 4 | 5 | 1 | 5 | ○ | ○Δ | ○ | 230,000 |
| Example 24 | 4 | 4 | 2 | 6 | ○ | ○ | ○ | 250,000 |
| Example 25 | 4 | 4 | 2 | 7 | ○ | ○ | ○ | 250,000 |
| Example 26 | 4 | 4 | 2 | 8 | ○ | ○ | ○ | 250,000 |
| Example 27 | 4 | 4 | 2 | 10 | ○ | ○ | ○ | 250,000 |
| Example 28 | 4 | 4 | 2 | 11 | ○ | ○ | ○ | 250,000 |
| Example 29 | 4 | 3 | 2 | 12 | ○ | ○ | ○ | 180,000 |
| Comparative Example 1 | 4 | 4 | 1 | 13 | X | ○ | X | 280,000 |
| Comparative Example 2 | 4 | 6 | 1 | 13 | Δ | ○ | X | 300,000 |
| Comparative Example 3 | 4 | 3 | 2 | 13 | X | ○ | X | 180,000 |
| Comparative Example 4 | 4 | 4 | 1 | 14 | ○ | X | X | 250,000 |
| Comparative Example 5 | 4 | 5 | 1 | 14 | ○ | Δ | X | 230,000 |
| Comparative Example 6 | 4 | 3 | 2 | 14 | ○ | X | X | 170,000 |
| Comparative Example 7 | 4 | 4 | 1 | 15 | X | ○ | X | 280,000 |
| Comparative Example 8 | 4 | 4 | 1 | 16 | ○ | X | X | 250,000 |

As is apparent from the results shown in Table 2, the method of preparing a lithographic printing plate according to the invention exhibits good development property in spite of the simple processing of one solution and one step which does not require a water washing step. Also, the method can provide a lithographic printing plate which maintains good printing durability and does not cause printing stain.

Example 30

In the violet semiconductor laser plate setter Vx9600 (having InGaN semiconductor laser (emission wavelength: 405 nm±10 nm/output: 30 mW)) produced by FUJIFILM Electronic Imaging Ltd., the semiconductor laser was replaced with a semiconductor laser having output of 100 mW, and the lithographic printing plate precursor used in Example 8 was subjected to image exposure in a plate surface exposure amount of 0.25 mJ/cm$^2$. The exposed lithographic printing plate precursor was then subjected to the development processing using Developer 3 in the automatic development processor having a structure shown in FIG. 1 wherein a heater in the pre-heater unit was turned off (specifically, without performing the pre-heating). Except as described above, the development property, processing property, printing staining property and printing durability were evaluated in the same manner as in Example 8. The results of evaluation were the development property of O, the processing property of O, the printing staining property of O and the printing durability of 280,000 sheets.

Example 31

A lithographic printing plate precursor prepared by combination of Support 4, Photosensitive layer 2 and Protective layer 1 was subjected to image exposure with halftone dots of 50% by TRENDSETTER 3244VX, (produced by Creo Co.) equipped with a water-cooled 40 W infrared semiconductor laser (830 nm) under the conditions of output of 9 W, a rotational number of an external drum of 210 rpm and resolution of 2,400 dpi. The exposed lithographic printing plate precursor was subjected to development processing using Developer 3 in the automatic development processor having a structure shown in FIG. 1 wherein a heater was set so as to reach the plate surface temperature at 100° C. in the pre-heating unit and the development processing was conducted at a transporting speed so as to make the immersion time (developing time) in the developer for 20 seconds. Then, with respect to the lithographic printing plate obtained, the development property, processing property, printing staining property and printing durability were evaluated in the same manner as in Example 8. The results of evaluation were the development property of O, the processing property of O, the printing staining property of O and the printing durability of 200,000 sheets.

Industrial Applicability

The method of preparing a lithographic printing plate according to the invention enables conducting a simple processing of one solution and one step which does not require a water washing step, exhibits excellent development property and can provide a lithographic printing plate which has good printing durability and does not cause printing stain.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Feb. 26, 2010 (Japanese Patent Application No. 2010-043130), and the contents thereof are incorporated herein by reference.

DESCRIPTION OF REFERENCE NUMERALS AND SIGNS

11: Transporting path of lithographic printing plate precursor
200: Pre-heating unit
300: Developing unit
400: Drying unit
202: Machine casing
208: Heating chamber
210: Skewer roller
212: Transporting inlet
214: Heater
216: Circulation fan
218: Transporting outlet
304: Insertion roller pair
306: Processing tank
308: Developing tank
310: Outer panel
312: Slit type insertion slot
316: Submerged roller pair
318: Carrying-out roller pair
322: Brush roller pair
324: Shielding cover
326: Brush roller pair
330: Spray pipe
332: Partition board
334: Slit type path-through slot
336: Liquid temperature sensor
338: Liquid level meter
342: Guide member
344: Guide roller
402: Support roller
404: Discharge slot
406: Transport roller pair
408: Transport roller pair
410: Duct
412: Duct
414: Slit hole
50: External tank
51: Overflow aperture
52: Upper limit liquid level meter
53: Lower limit liquid level meter
54: Filter unit
55: Developer supply pump
C1: First circulation pipeline
C2: Second circulation pipeline
71: Water tank for replenishment
72: Water-replenishing pump
C3: Third circulation pipeline

The invention claimed is:

1. A method of preparing a lithographic printing plate comprising: exposing a lithographic printing plate precursor comprising a photosensitive layer containing (A) a polymerization initiator, (B) a polymerizable compound, (C) a sensitizing dye and (D) a binder polymer and a protective layer in this order on a hydrophilic support with laser; and then removing the protective layer and an unexposed area of the photosensitive layer in the presence of a developer, wherein:
the developer is a developer which has pH of from 2 to less than 10 and contains an amphoteric surfactant and a nonionic surfactant having an alkylene oxide chain;

the amphoteric surfactant is at least one amphoteric surfactant represented by the following formula (1) or (2):

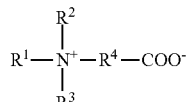
(1)

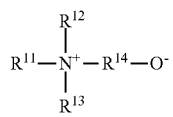
(2)

wherein, in the formula (1), $R^1$ represents an alkyl group having from 8 to 20 carbon atoms or an alkyl group having a connecting group which has from 8 to 20 carbon atoms in total, $R^2$ and $R^3$ each independently represents an alkyl group or a group containing an ethyleneoxide group, $R^4$ represents a single bond or an alkylene group, and two groups of $R^1$, $R^2$, $R^3$ and $R^4$ may be combined with each other to form a ring structure;

and in the formula (2), $R^{11}$ represents an alkyl group having from 8 to 20 carbon atoms or an alkyl group having a connecting group which has from 8 to 20 carbon atoms in total, $R^{12}$ and $R^{13}$ each independently represents a hydrogen atom, an alkyl group or a group containing an ethyleneoxide group, $R^{14}$ represents a single bond or an alkylene group, and two groups of $R^{11}$, $R^{12}$, $R^{13}$ and $R^{14}$ may be combined with each other to form a ring structure; and the nonionic surfactant having an alkylene oxide chain is at least one nonionic aromatic ether surfactant represented by the following formula (3):

(3)

wherein, in the formula (3), X represents an aromatic group, Y represents single bond or an alkylene group having from 1 to 10 carbon atoms, A and B, which are different from each other, each represents —CH$_2$CH$_2$O— or —CH$_2$CH(CH$_3$)O—, and n and m each represents an integer from 0 to 100, provided that the sum of n and m is 2 or more.

2. The method of preparing a lithographic printing plate as claimed in claim 1, wherein the sum of carbon atoms in $R^1$ to $R^4$ or the sum of carbon atoms in $R^{11}$ to $R^{14}$ is from 10 to 40.

3. The method of preparing a lithographic printing plate as claimed in claim 1, wherein the developer further contains a pH buffer agent.

4. The method of preparing a lithographic printing plate as claimed in claim 3, wherein the pH buffer agent is a carbonate ion and a hydrogen carbonate ion.

5. The method of preparing a lithographic printing plate as claimed in claim 3, wherein the pH buffer agent is a water-soluble amine compound and an ion of the amine compound.

6. The method of preparing a lithographic printing plate as claimed in claim 1, wherein the developer further contains a water-soluble polymer compound.

7. The method of preparing a lithographic printing plate as claimed in claim 1, wherein (B) the polymerizable compound has a urethane bond or a urea bond.

8. The method of preparing a lithographic printing plate as claimed in claim 1, wherein (D) the binder polymer is a polyurethane resin having an acid group.

9. The method of preparing a lithographic printing plate as claimed in claim 1, which does not comprise a water washing step.

10. A developer for lithographic printing plate precursor which has pH of from 2 to less than 10 and contains an amphoteric surfactant represented by the following formula (1) or (2) and a nonionic aromatic ether surfactant represented by the following formula (3):

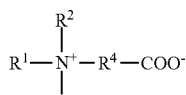
(1)

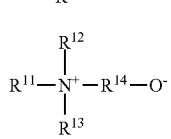
(2)

wherein in the formula (1), $R^1$ represents an alkyl group having from 8 to 20 carbon atoms or an alkyl group having a connecting group which has from 8 to 20 carbon atoms in total, $R^2$ and $R^3$ each independently represents an alkyl group or a group containing an ethyleneoxide group $R^4$ represents a single bond or an alkylene group, and two groups of $R^1$, $R^2$, $R^3$ and $R^4$ may be combined with each other to form a ring structure;

and in the formula (2), $R^{11}$ represents an alkyl group having from 8 to 20 carbon atoms or an alkyl group having a connecting group which has from 8 to 20 carbon atoms in total, $R^{12}$ and $R^{13}$ each independently represents a hydrogen atom, an alkyl group or a group containing an ethyleneoxide group, $R^{14}$ represents a single bond or an alkylene group, and two groups of $R^{11}$, $R^{12}$, $R^{13}$ and $R^{14}$, may be combined with each other to form a ring structure;

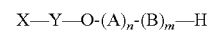
(3)

wherein in the formula (3), X represents an aromatic group, Y represents single bond or an alkylene group having from 1 to 10 carbon atoms, A and B, which are different from each other, each represents —CH$_2$CH$_2$O— or —CH$_2$CH(CH$_3$)O—, and n and m each represents an integer from 0 to 100, provided that a sum of n and m is 2 or more.

11. The developer for lithographic printing plate precursor as claimed in claim 10, wherein the sum of carbon atoms in $R^1$ to $R^4$ or the sum of carbon atoms in $R^{11}$ to $R^{14}$ is from 10 to 40.

12. The developer for lithographic printing plate precursor as claimed claim 10, wherein the developer further contains a pH buffer agent.

13. The developer for lithographic printing plate precursor as claimed in claim 12, wherein the pH buffer agent is a carbonate ion and a hydrogen carbonate ion.

14. The developer for lithographic printing plate precursor as claimed in claim 12, wherein the pH buffer agent is a water-soluble amine compound and an ion of the amine compound.

15. The developer for lithographic printing plate precursor as claimed claim 10, wherein the developer further contains a water-soluble polymer compound.

16. The method of preparing a lithographic printing plate as claimed in claim 1, wherein the developer has pH of from 6.8 to 9.9.

17. The developer for lithographic printing plate precursor as claimed claim 10, wherein the developer has pH of from 6.8 to 9.9.

18. The method of preparing a lithographic printing plate as claimed in claim 1, wherein the amphoteric surfactant is at least one amphoteric surfactant represented by formula (2).

19. The method of preparing a lithographic printing plate as claimed in claim 1, wherein the developer contains at least one amphoteric surfactant represented by formula (1), at least one amphoteric surfactant represented by formula (2), and at least one nonionic aromatic ether surfactant represented by formula (3).

* * * * *